(12) United States Patent
Vorndran et al.

(10) Patent No.: US 9,625,671 B2
(45) Date of Patent: Apr. 18, 2017

(54) LASER MODULE AND SYSTEM

(71) Applicant: LaserMax, Inc., Rochester, NY (US)

(72) Inventors: Kenneth R. Vorndran, West Henrietta, NY (US); Brian L. Olmsted, Spencerport, NY (US); Daniel J. Balonek, Bergen, NY (US)

(73) Assignee: LaserMax, Inc., Rochester, NY (US)

( * ) Notice: Subject to any disclaimer, the term of this patent is extended or adjusted under 35 U.S.C. 154(b) by 0 days.

(21) Appl. No.: 14/521,561

(22) Filed: Oct. 23, 2014

(65) Prior Publication Data

US 2015/0109680 A1    Apr. 23, 2015

Related U.S. Application Data

(60) Provisional application No. 61/894,711, filed on Oct. 23, 2013.

(51) Int. Cl.
| | | |
|---|---|---|
| G02B 27/30 | (2006.01) | |
| G02B 3/00 | (2006.01) | |
| G02B 7/02 | (2006.01) | |
| H01S 5/022 | (2006.01) | |
| G02B 19/00 | (2006.01) | |
| H01S 5/024 | (2006.01) | |

(52) U.S. Cl.
CPC ......... *G02B 7/028* (2013.01); *G02B 19/0014* (2013.01); *G02B 19/0052* (2013.01); *H01S 5/02288* (2013.01); *H01L 2224/48091* (2013.01); *H01L 2224/49109* (2013.01); *H01S 5/02212* (2013.01); *H01S 5/02469* (2013.01)

(58) Field of Classification Search
USPC .......................................... 359/641, 642–650
See application file for complete search history.

(56) References Cited

U.S. PATENT DOCUMENTS

| | | |
|---|---|---|
| 4,280,107 A | 7/1981 | Scifres et al. |
| 4,737,028 A | 4/1988 | Smith |
| 5,004,317 A | 4/1991 | Jackson et al. |
| 5,770,473 A | 6/1998 | Hall et al. |
| 5,901,168 A | 5/1999 | Baillargeon et al. |
| 6,072,814 A | 6/2000 | Ryan et al. |
| 6,449,434 B1 | 9/2002 | Fuss |
| 6,740,963 B2 | 5/2004 | Kaneko et al. |
| 6,868,104 B2 | 3/2005 | Stewart et al. |
| 6,922,423 B2 | 7/2005 | Thornton |
| 7,259,905 B2 | 8/2007 | Nakae et al. |

(Continued)

FOREIGN PATENT DOCUMENTS

| | | |
|---|---|---|
| DE | 10205310 A1 | 9/2003 |
| EP | 1291987 A2 | 12/2003 |

(Continued)

OTHER PUBLICATIONS

Daiker, Jeffrey T., "Athermalization Techniques in Infrared Systems", OPTI 521, Dec. 6, 2010, Fall 2010 Tutorial.

(Continued)

*Primary Examiner* — Mohammed Hasan
(74) *Attorney, Agent, or Firm* — Roland R. Schindler; Brian Shaw; Harter, Secrest & Emery

(57) ABSTRACT

Laser modules and systems are provided that are smaller, lighter, and less complex and while more reliably generating collimated laser beams having limited divergence.

18 Claims, 16 Drawing Sheets

(56) References Cited

U.S. PATENT DOCUMENTS

| | | | |
|---|---|---|---|
| 7,400,791 | B2 | 7/2008 | Kagaya |
| 7,463,659 | B2 | 12/2008 | Go et al. |
| 7,492,806 | B2 | 2/2009 | Day et al. |
| 7,535,656 | B2 | 5/2009 | Day et al. |
| 7,837,398 | B2 | 11/2010 | Sato et al. |
| 7,920,608 | B2 | 4/2011 | Marsland, Jr. et al. |
| 8,442,081 | B2 | 5/2013 | Marsland, Jr. et al. |
| 2002/0064198 | A1 | 5/2002 | Koizumi |
| 2003/0218923 | A1 | 11/2003 | Giaretta et al. |
| 2004/0032891 | A1 | 2/2004 | Ikeda et al. |
| 2005/0008049 | A1 | 1/2005 | Oomori et al. |
| 2005/0157769 | A1 | 7/2005 | Ito et al. |
| 2005/0196112 | A1 | 9/2005 | Takagi |
| 2005/0207943 | A1 | 9/2005 | Puzey |
| 2007/0019702 | A1* | 1/2007 | Day ............... B82Y 20/00 372/101 |
| 2007/0237196 | A1 | 10/2007 | Oomori |
| 2007/0291804 | A1 | 12/2007 | Day et al. |
| 2011/0085767 | A1 | 4/2011 | Miao |
| 2012/0045161 | A1 | 2/2012 | Okada |
| 2012/0229910 | A1* | 9/2012 | Durkin ............... H01S 3/005 359/641 |
| 2013/0322479 | A1 | 12/2013 | Sugiyama et al. |
| 2014/0294024 | A1 | 10/2014 | Kim |

FOREIGN PATENT DOCUMENTS

| | | |
|---|---|---|
| EP | 1411602 A1 | 4/2004 |
| WO | 03067720 A2 | 8/2003 |

OTHER PUBLICATIONS

Power Generator Module Installation, Application Notes, Copyright 2008-2011, Custom Thermoelectric, Bishopville, MD, www.customthermoelectric.com. Dec.

Weidmann et al., "Development of a compact quantum cascade laser spectrometer for field measurements of CO2 Isotope", Applied Physics B 80, 255-260 (2005). Dec.

Thierry, Aellen et al., "Continuous-wave distrubuted-feedback quantum-cascade lasers on a Peltier cooler", Applied Physics Letters, vol. 83, No. 10, Sep. 8, 2003.

"To Can Design for VCSEL", Motorola disclosure, Mar. 1, 1998, ret. from IP.Com Disclosure No. IPCOM000008579D on Sep. 27, 2013.

Tittel et al., "Transportable automated ammonia sensor based on a pulsed thermoelectrically cooled quantum-cascade distributed feedback laser", Optical Society of America cited in Applied Optics, Jan. 20, 2002.

RMT Ltd. catalogue, Thermoelectric Cooling Solutions, "Butterfly" 14pin Sub-Assemblies.http://rmtltd.ru/products/submounts/butterfly/index.php?print=Y, ret. Oct. 14, 2013.

RMT Ltd. catalogue, Thermoelectric Cooling Solutions, HHL Packge. http://rmtltd.ru/products/submounts/hhl/index.php?print=Y, ret. Oct. 14, 2013.

Intense Package Options, INTENSECO.com. Intense:HHL, http://www.intenseco.com/products/hpd/packaage-options/hhl.asp, ret. Oct. 14, 2013.

Intense Package Options, INTENSECO.com. Intense:TEC, http://www.intenseco.com/products/hpd/packaage-options/Inc_tec.asp, ret. Oct. 14, 2013.

Intense Package Options, INTENSECO.com. Intense:Butterfly (BUTF) http://www.intenseco.com/products/hpd/packaage-options/butterfly.asp. ret. Oct. 14, 2013.

Intense Package Options, INTENSECO.com. Intense:TO3 http://www.intenseco.com/products/hpd/packaage-options/to3.asp. ret. Oct. 14, 2013.

Intense Package Options, INTENSECO.com. Intense: 9mm, http://www.intenseco.com/products/hpd/packaage-options/9mm.asp. ret. Oct. 14, 2013.

Intense Package Options, INTENSECO.com. Intense:TO56 (5.6 mm), http://www.intenseco.com/products/hpd/packaage-options/5-6mm.asp. ret. Oct. 14, 2013.

* cited by examiner

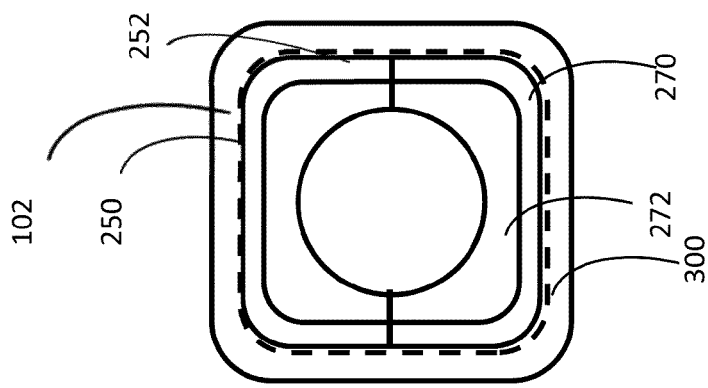
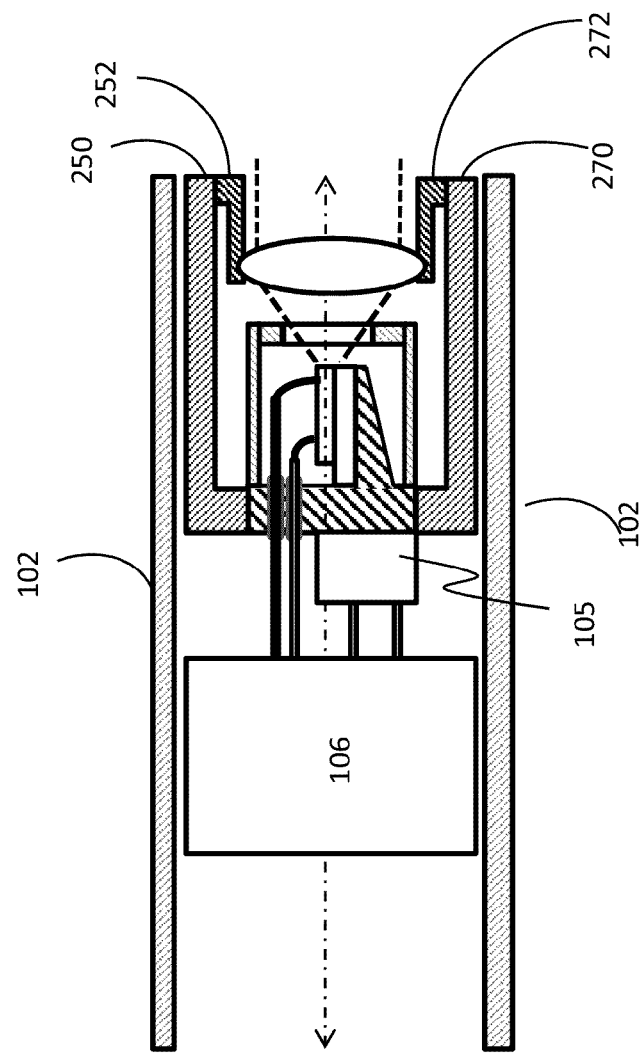
FIG. 21
FIG. 20

LASER MODULE AND SYSTEM

CROSS-REFERENCE TO RELATED APPLICATIONS

This application claims the benefit of U.S. Provisional Application No. 61/894,711 filed Oct. 23, 2013.

BACKGROUND OF THE INVENTION

Field of the Invention

The present invention relates to solid state laser modules and laser systems that incorporate solid state laser modules.

Description of Related Art

Laser devices that incorporate solid state laser modules are used for a variety of purposes including but not limited to applications such as target marking, pointing, designating, aiming, data communication, and stand-off spectral analysis. These applications require laser systems that are capable of directing laser beam through free space to create a laser spot on a distant target that reflects enough light to be observed or sensed by an electronic sensor such as a spectrometer, a spectrophotometer or an array type image sensor that may itself be a great distance from the target. To accomplish this, it is necessary to provide a laser beam that forms a spot of laser light on the distant target having at least a minimum intensity. Such applications require a laser system that can emit a laser beam with limited divergence.

In many of these applications, it is also necessary that such laser devices are in a form that is easily transported to a point of use and that can be readily and reliably operated when needed. This requires laser devices that are lighter, have a smaller cross-sectional area and reduced volume while still being robust enough to operate after being exposed to vibration, tension, compression, bending forces, torsional loads, and environmental extremes during transport and use. It is particularly important in military, homeland security, first responder applications that such laser devices will remain operational even when exposed to high levels of shock.

However, it is challenging to design and assemble smaller laser devices. In part this is because the natural inclination of engineers and scientists is to achieve size reduction through the simple expedient of downscaling extent designs and processes. However, in the field of laser technology simply using smaller versions of components to achieve system size reductions rarely achieves reliable results.

An example of the complications that can arise when seeking to downsize laser systems through downscaling components can be illustrated with reference to U.S. Pat. No. 7,492,806, entitled "Compact Mid-IR Laser" which describes what is known in the art as a high heat load laser module.

FIG. 1 shows an exploded isometric view adapted from FIG. 2A of the '806 patent. FIG. 2 shows generally a front elevation view of such a high heat load laser module. As can be seen in FIG. 1, high heat load laser module 10 has a housing 12 that can be on the order of 3 cm×4 cm×6 cm. Housing 12 contains a quantum cascade laser 14 that emits infrared light, a submount 16 on which quantum cascade laser 14 sits. A heat spreader 18 has a keyway 20 within which submount 16 is mounted. Housing 12 also contains drive circuitry 24, a thermoelectric cooling system 26, a lens 28 and conductors 30 that extend through sidewalls of sealed box 12 to supply electrical energy and control signals to drive circuitry 24, a thermoelectric cooling system 26 and quantum cascade laser 14.

Box 12 is comprises a front wall 32 with an opening 34 and a window 36, a lid 38, a base 40 and a rear wall 48. Heat spreader 18 is positioned so that quantum cascade laser 14 directs divergent infrared light toward window 36. Lens 28 is positioned between quantum cascade laser 12 and window 36 to collect infrared light emitted by quantum cascade laser 14 and to focus this light.

The '806 patent uses a small focal length lens and asserts that "the small focal length of the lens is important in order to realize a small overall footprint of the laser device." The lens 28 "may comprise an aspherical lens with a diameter approximately equal to or less than 10 mm and preferably approximately equal to or less than 5 mm. Thus, the focal length may be one of approximately 1, 2, 3, 4, 5, 6, 7, 8, 9, 10, 11, 12, 13, 14, 15, 16, 17, 18, 19, or 20 mm and any fractional values thereof. The focal length of the lens 14 is fabricated to be approximately ½ the size of the diameter. Thus, 10 mm diameter lens will have a focal length of approximately 5 mm, and a 5 mm diameter lens will have a focal length of approximately 2.5 mm."

Similarly, the importance of using a small or short focal length lens to provide smaller sized laser systems has been described in other patents including U.S. Pat. No. 7,535,656, filed on Sep. 22, 2006 which notes that "embodiments include optical components arranged as mid-IR, high numerical aperture, short focal length lenses. In particular, lenses which have a high transmission for mid-IR spectra further having numerical apeatures greater than about 0.7 and a focal length less than about 10 millimeters" and later defines the term short focal length lens as referring "to lenses and focusing mirrors which have a focal length less than about 8 millimeters. As there is no certain meaning associated with a lens having f=0, we declare a lower limit on our 'short focal length' to be about 0.5 millimeters. Any value between 0.5 and 8 millimeters is herein considered a short focal length."

However, the design decision to use a small or short focal length lens 28 presents a number of design challenges. First, this requires that lens 28 is in close proximity to quantum cascade laser 14. In the '806 patent, this is accomplished by placing lens 28 and lens support structures 35 inside box 12 adding to the challenges of designing and manufacturing box 12.

This in turn requires positioning lens 28 with a high degree of accuracy relative to quantum cascade laser 14. The '806 patent seeks to meet this requirement by utilizing the heat spreader 18 as an optical platform, noting that "[t]he output lens . . . and laser gain medium . . . are held in a secured, fixed and rigid relationship to one another by virtue of being fixed to the optical platform. The use of the heat spreader . . . as a monolithic support block for both lens . . . and laser gain medium . . . is said to be among "other factors contributing to the small footprint include the monolithic design of the various elements, particularly as related to the positioning of the optical components and the ability to efficiently remove the large amount of heat from the QCL serving as the laser gain medium.

The '806 patent also describes positioning heat spreader 18 on thermoelectric cooling system 26 and the thermoelectric cooling system 26 in turn is positioned on a surface that can transfer heat from box 12. Thermoelectric cooling system 26 is used to ensure that heat spreader 18 maintains a temperature where heat spreader 18 holds the output lens [28] and laser gain medium [14] are held in the secured, fixed and rigid relationship.

This approach requires an increase in the size of thermoelectric cooling system 26, an increase in the thermal mass that must be cooled by thermoelectric cooling system 26 and a concomitant increase in the amount of energy that will be consumed by thermoelectric cooling system 26 during use. This, in turn, reduces the overall efficiency of a laser device that uses high heat load laser module 10, and increases the weight and size of portable power supplies that must be provided in a laser device that incorporates high heat load laser module 10.

Additionally, limitations on the size and position of lens 28 can limit the ability of lens 28 to reduce the divergence of the mid-wave or long-wave infrared light emitted by quantum cascade laser 14. Thus, where it is desirable that a laser device that uses high heat load laser module 10 provides a collimated beam additional focusing optics outside of high heat load laser module 10 are generally needed. This, in turn, requires that a laser device that uses high heat load laser module 10 provide additional optical elements and mounting structures. The additional optical elements and mounting structures further increase the volume, weight, complexity, and cost of the laser device while introducing additional vectors through which the reliability and ruggedness of the laser device may be reduced.

As is also shown in FIGS. 1 and 2, high heat load laser module 10 includes a plurality of electrical conductors 30 that project from sidewalls 42 and 44. As is apparent from FIG. 2, the use of side wall projecting electrical conductors 30 in high heat load laser module 12 causes high heat load laser module 12 to have a significant cross sectional area causing a laser device that incorporates high heat load laser module 12 to have an even larger cross sectional area.

For example, as is shown in FIG. 2, a laser device that is to incorporate high heat load laser module 12 in, for example, a cylindrical package, will have a minimum theoretical radius 48. However, in application a laser device that uses high heat load laser module 12 will be required to provide connectors (not shown) that connect to ends of conductors 30 and therefore will have a larger required radius to accommodate laterally joined connectors. Further, to the extent that it is desired to enclose the connectors and the laser module, such an enclosure will add additional radius and cross sectional area.

Smaller high heat load laser modules are known. For example the DFB-CW type quantum cascade lasers sold by Hamamatsu Corporation, Japan include conductors that project from one or the other of sidewalls of a box, however the size enhancing effects of side projecting conductors are only partially ameliorated by this approach.

Another concern with the high heat load laser module 12 is that high heat load laser modules 12 are highly specialized designs that are intended for specific purposes and that do not easily allow modification and repurposing. Accordingly any use of such a module for another purpose requires adaptive electronics, hardware and optics, which increase the cost, size, weight and complexity of a laser emitting product.

It will be appreciated from this that other approaches are needed.

One alternative approach is shown in German patent publication number DE10205301A1, filed on Feb. 2, 2002. FIG. 3 is a side view of a laser device adapted from the '301 publication. This patent publication describes the use of a laser device 50 having a quantum cascade laser LED 52 that is contained between a base section 54 and a housing section 58. Electrical conductors pass through base 54 and extend along an axis 60 in a first direction, while quantum cascade laser 52 is arranged on a pedestal 56 on base 54 to emit light generally along axis 60 in a second direction.

In one embodiment, housing 58 has a front wall section 62 with an opening 64 through which radiation from quantum cascade laser 54 can pass. A lens 66, preferably a Fresnel lens, is inserted the opening 64. Lens 66 collimates a light emitted by quantum cascade laser 54 to form a beam. As is described in the '301 application, a distance d separates the quantum cascade laser 54 and lens 66. To achieve desired collimation the distance d is equal to a focal length of lens 66.

Another laser module design has been proposed in US Pat. App. No. 2005/0008049 entitled "optical module including a Peltier device therein and having a coaxial type package" filed by Oomori et al. on Jun. 2, 2004.

FIG. 4 shows a cutaway portion isometric view of a co-axial laser module 70 and adapted from the '049 application and FIG. 5 shows an end view of laser module 70. As is shown in FIGS. 4 and 5 conductors 72 are positioned on one side of a base 74 and a semiconductor diode laser 76 is positioned on the opposite side of base 74 and enclosed by a housing 78. An opening 82 is provided in housing 78 to provide a light path out of housing 78 and a lens 84 is positioned in opening 82 to reduce the extent of the divergence of light emitted by semiconductor diode laser 76.

This approach attempts to solve some of the aforementioned problems by providing a thermo-electric cooler 86 between base 74 and housing 78 and assembling a support 88 for a semiconductor diode laser 76 onto thermoelectric cooler 86 to provide a shorter path for heat transfer between semiconductor diode laser 76 and thermoelectric cooler (described as a Peltier device) 86.

However, this approach makes the process of designing a laser module in a coaxial design more challenging by requiring the installation of thermoelectric cooler 84 within the coaxial package, the connection of additional electrical connectors to thermoelectric cooler 86, the mounting of a stem at an angle that is normal to the mounting surface on thermoelectric cooler 86, and the mounting of a semiconductor laser diode to support 88 at an angle that is normal to support 88. Further, this approach limits the overall size and thermal management capabilities of the thermoelectric cooler 84.

Still another approach to providing an alternative to a high heat load package is described in U.S. Pat. No. 8,442,081 entitled "Quantum Cascade Laser Suitable for Portable Applications" filed on Apr. 25, 2012. This describes a laser device with a lens system at a first end that emits collimated infrared light and a cap at a second end. A quantum cascade laser directs divergent laser light toward the lens. A control circuit and a battery storage area are positioned between the quantum cascade laser and the cap. Heat from the quantum cascade laser passes from the quantum cascade laser through a heat spreader providing what is described as a short path to a laser housing to provide a limited amount of passive cooling. A drive circuit operates the quantum cascade laser at a low duty cycle to limit the amount of heat generated by the quantum cascade laser to an amount that can be dissipated by the limited amount of passive cooling.

Effectively the package described in the '081 patent offers a designer a simple tradeoff: forgo the problems associated with the use of a thermoelectric cooling device at the cost of limiting laser use to a level only generates so much heat as can be passively dissipated by the laser system.

Additionally, it will be appreciated that, the use of laser module housings to position lens systems as is shown in the '301 publication, the '049 application and the '081 patent imposes a number of constraints on the design of the laser module. For example, the laser module housing must be designed and assembled so that the lens is held in optical alignment with the quantum cascade laser that is supported on the base and is separated from the quantum cascade laser by the focal distance of the lens. Additionally, the housing and the lens must be designed and assembled such that the relative alignment and positioning of the lens and the quantum cascade laser do not change because of changing thermal conditions that arise during operation laser or changing environmental conditions.

Similarly, positioning a lens at an opening of a laser module housing places many constraints on the optical properties of the lens and the mountings used to join the lens to the housing. For example, cross-sectional area constraints housing, volume constraints of the housing, as well as mechanical and thermal properties of the housing will impose limitations on the size and shape of the lens.

Another challenge that must be met when the lens is placed in the opening of a laser module housing arises when the laser module is to form part of a hermetic or other seal to provide a controlled environment around the quantum cascade laser. For example, in some cases it can be advantageous to operate the quantum cascade laser in a low pressure or vacuum environment or to operate the quantum cascade laser in the presence of inert gasses or even to simply limit the humidity in the environment about the quantum cascade laser. Where it is beneficial to provide such controlled environments within a laser module, a seal, typically a hermetic seal is required and it is necessary that both the lens and lens mounting are designed and assembled to operate as a function of the seal. However, it is also necessary that the optical functions of the lens and the lens mounting are not compromised by incorporating the lens and the mounting into the design of the housing.

This requires new and innovative approaches to providing lens mountings, lens designs and assembly processes that can be efficiently used to establish an effective seal while also allowing the lens to be positioned at a precise optical alignment and relative position to the quantum cascade laser.

It will be understood that these design challenges are not easily met. Accordingly, what is still needed in the art is a new laser module package with reduced cross-sectional area requirements, reduced volume requirements, reduced weight, greater efficiency, reduced complexity, greater ease of manufacturability, increased portability, greater resistance to shock, vibration, tension, compression, and bending, thermal variations, and environmental conditions.

As is noted above, there are many possible applications for solid state lasers. These applications typically have different performance requirements including but not limited to different laser coherence, divergence, output powers, ruggedness and portability requirements, efficiencies, intensities and wavelengths. Accordingly, each different application may have other specialized optical, mechanical or electrical features. When such systems are packaged with lenses that are internal to or otherwise joined to a laser housing there is an inherent linkage between the laser used and the system requiring redesign of the entire module for each compact laser/lens solution.

What are needed therefore, are laser systems and laser modules for use in laser systems that are smaller, lighter more compact and less complex without introducing the reliability, design, and manufacturing complexities.

BRIEF SUMMARY OF THE INVENTION

In aspects of the invention, optical systems are provided for a semiconductor laser that emits a divergent laser light. In one example, the optical system has a lens with a focal length of greater than 10 mm and that can collimate the divergent laser light into a collimated beam having less than a predetermined divergence when the lens is positioned within a larger range of positions about a focal length of the lens; and, a frame is assembled to the lens to hold the lens within the larger range of positions when the system is in a first range of temperature. The larger range of positions is at least 50 percent greater than a smaller range of positions that an alternate smaller lens having a same numerical aperture as the lens and smaller focal length can be positioned within to provide a collimated beam having less than the predetermined divergence.

In other aspects of the invention, laser systems are provided having an enclosure having a front wall with a window therein and a back wall from which a header extends; a semiconductor laser positioned on the header to direct a divergent laser light through the window; a lens with a focal length of greater than 10 millimeters, and that can collimate the divergent laser light into a collimated beam having less than a predetermined divergence when the lens is positioned within a range of positions about a focal length of the lens; and, a frame assembled to the lens to hold the lens apart from the semiconductor laser at or about the focal length of the lens over a range of temperature. A drive circuit links a power supply to the semiconductor laser, and a housing holds the drive circuit, the power supply, the enclosure, the lens and the frame so that the collimated laser beam emits from the housing. The range of positions is at least 50 percent greater than a second range of positions that an alternate lens having a same numerical aperture as the lens and a diameter of less than about 10 mm can be positioned within to provide a collimated beam having less than the predetermined divergence.

BRIEF DESCRIPTION OF THE SEVERAL VIEWS OF THE DRAWING(S)

FIG. 20 is a cross-section partial view of an embodiment of a laser module.

FIG. 21 is an end view of the embodiment of FIG. 20.

DETAILED DESCRIPTION OF THE INVENTION

Figure 1:
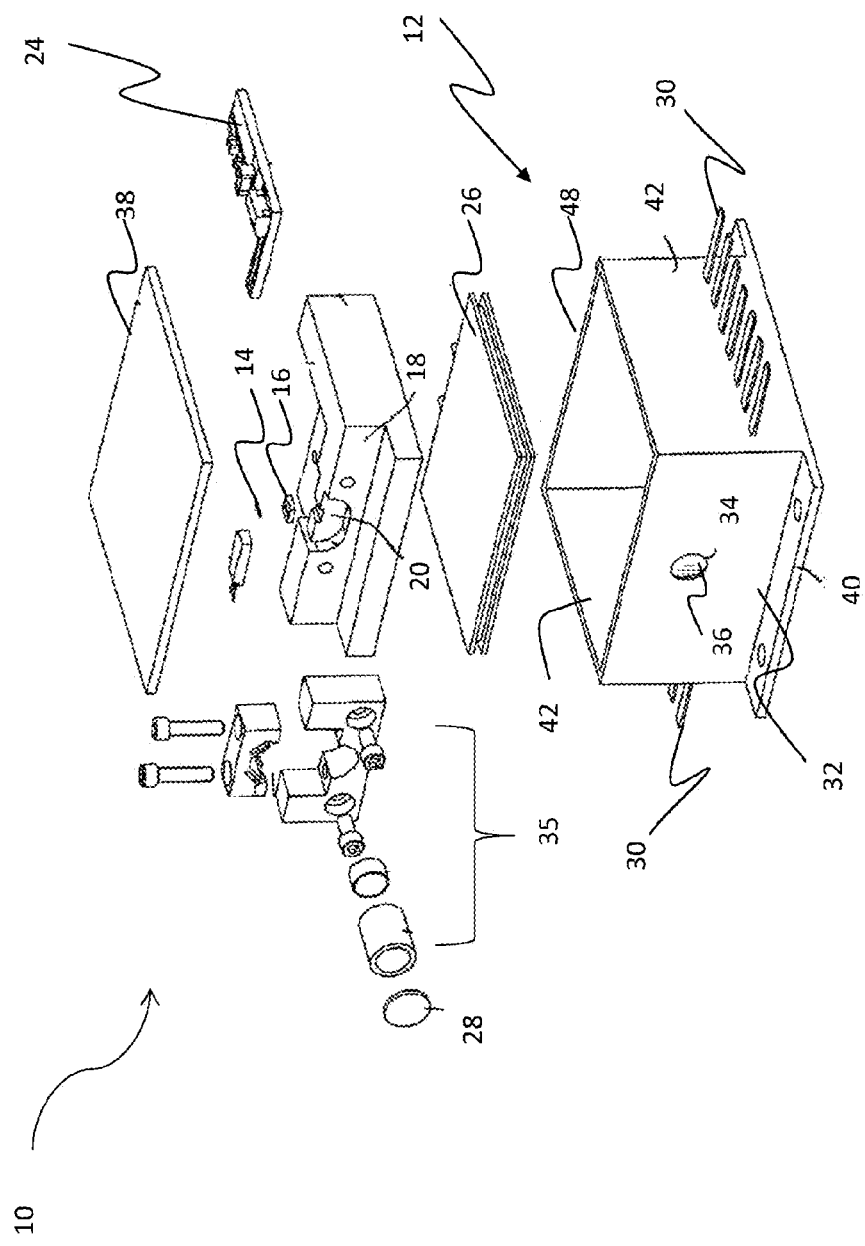
FIG. 1 shows an exploded isometric view of a prior art high heat load laser module package.
Figure 2:
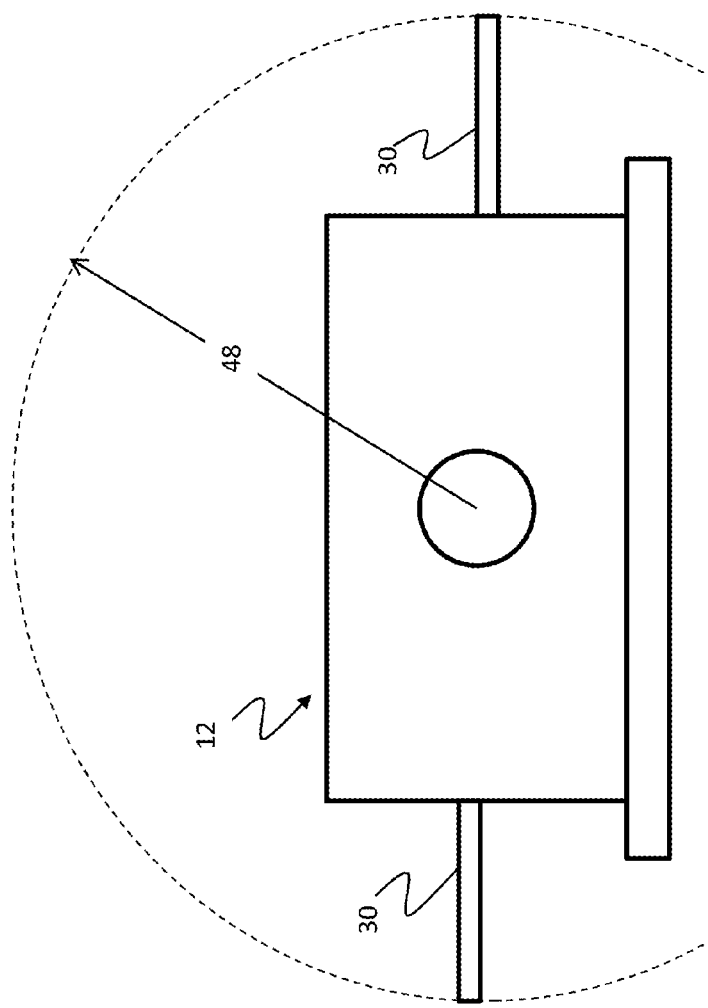
FIG. 2 shows a front assembled elevation view of the high heat load laser module package of FIG. 1
Figure 3:
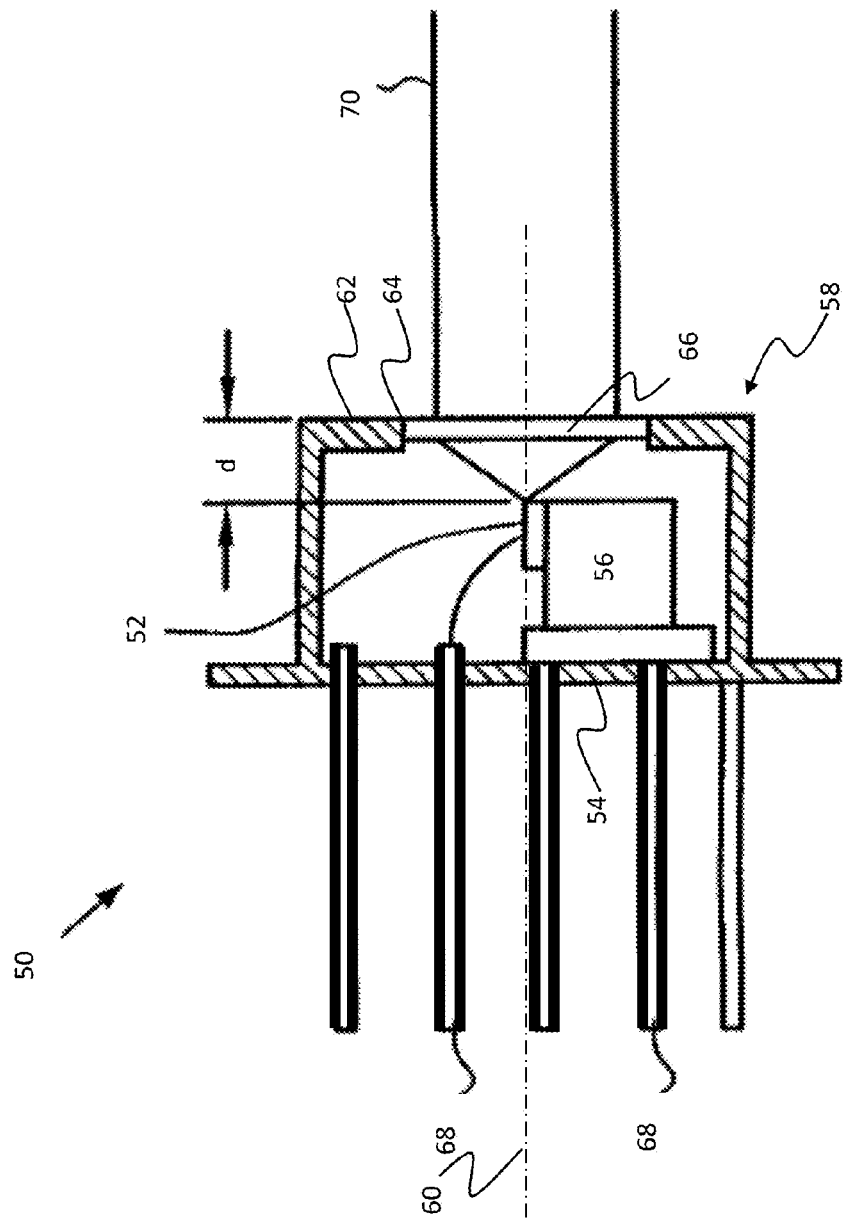
FIG. 3 shows an example of a prior art laser module presenting an alternative to the high heat load laser module package of FIGS. 1 and 2.
Figure 5:
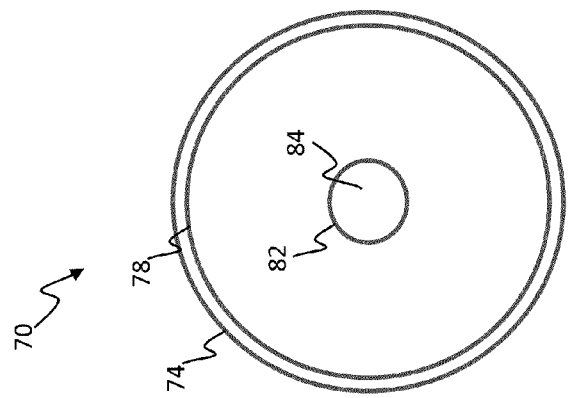
FIG. 5 shows a front elevation view of the prior art laser module of FIG. 4.
Figure 4:
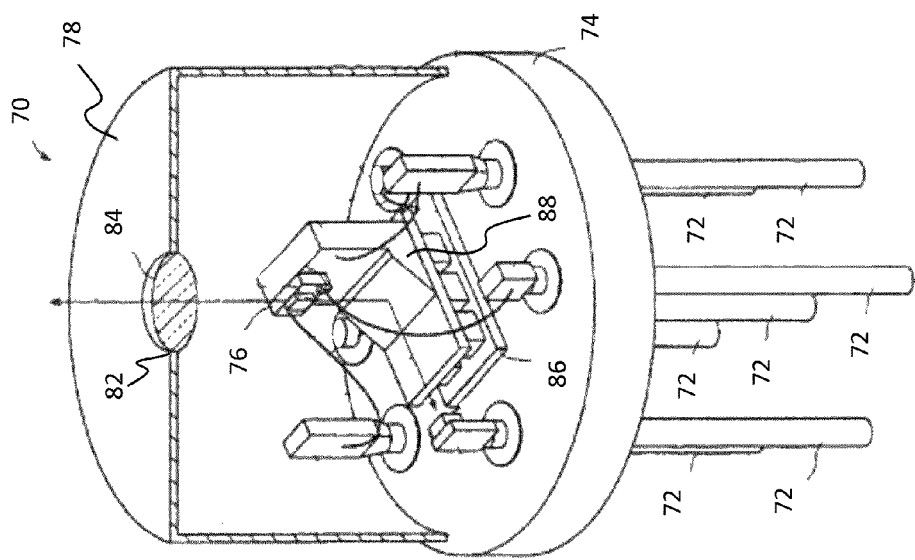
FIG. 4 shows a side isometric view of an example of a prior art laser module presenting an alternative to the high heat load laser module package.
Figure 6:
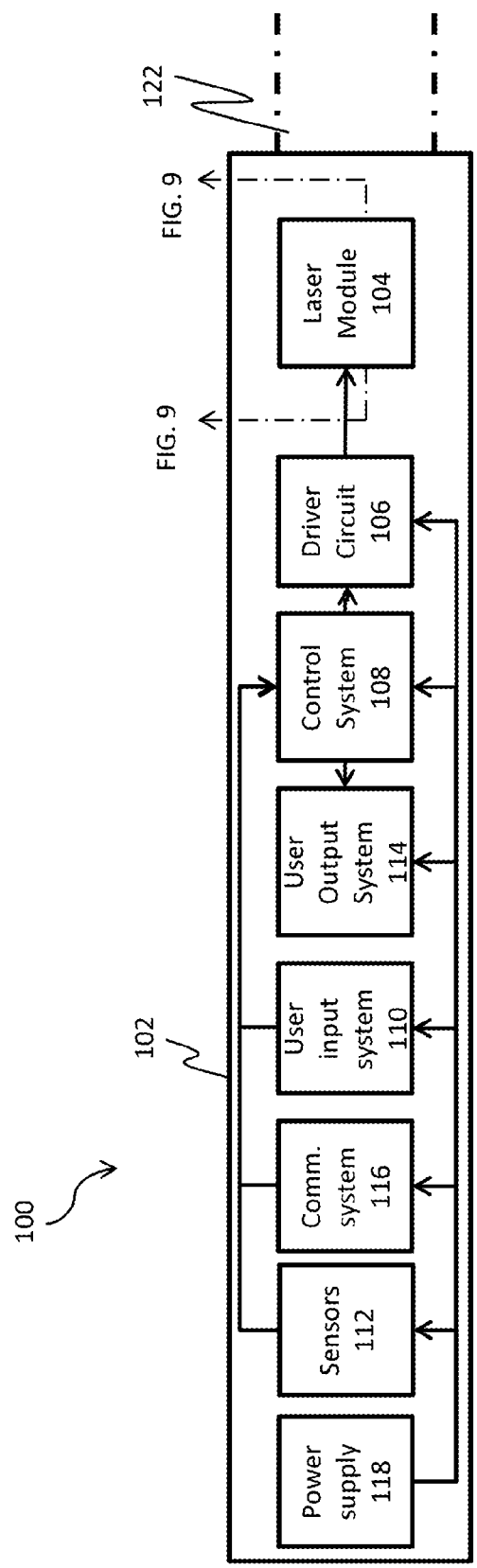
FIG. 6 is a schematic view of a first embodiment of a laser device according to a first embodiment of the invention.
Figures 7, 8:
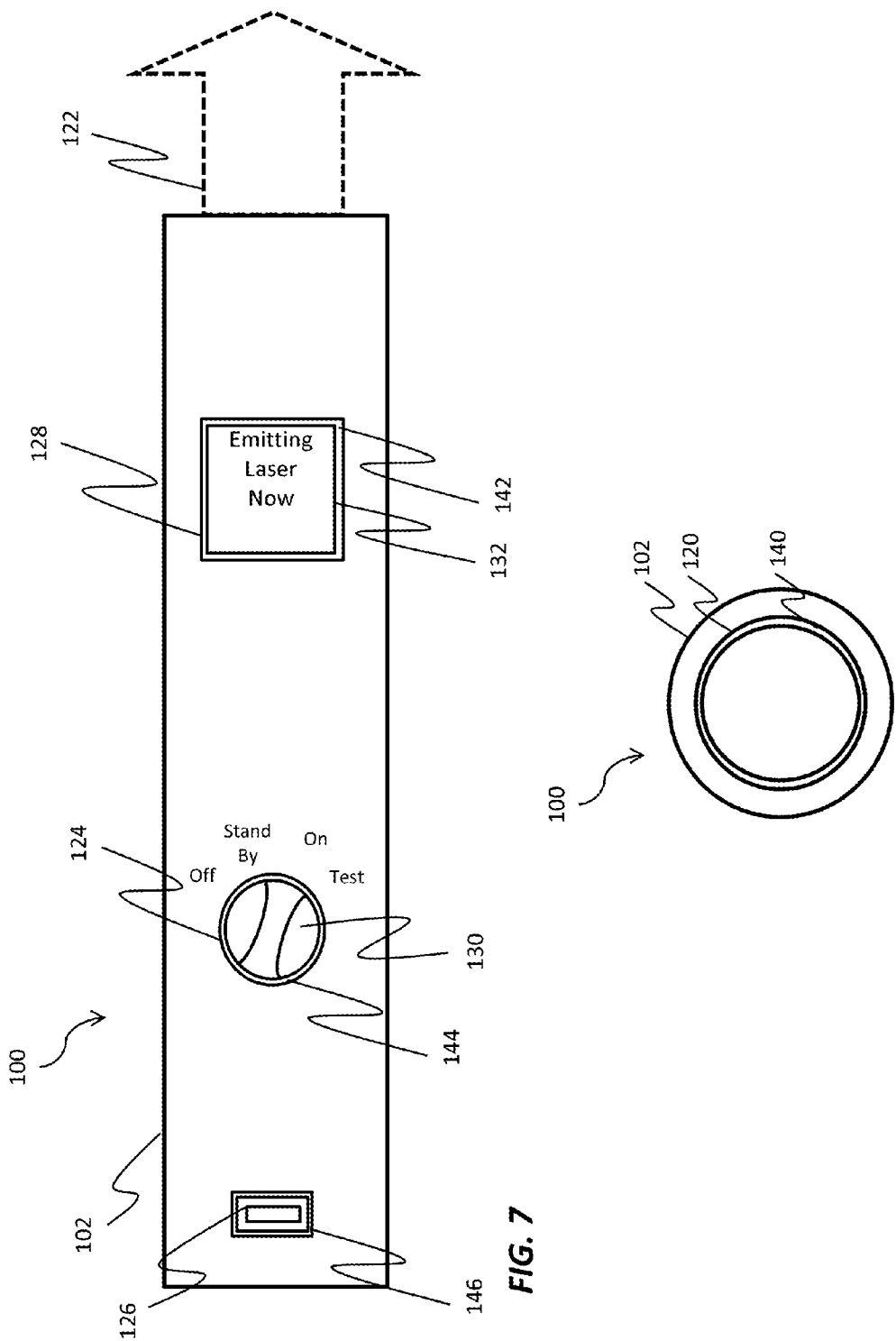
FIG. 7 is a top view of one embodiment of a laser system according to the embodiment of FIG. 6.
FIG. 8 is an end view of the embodiment of FIG. 7.

FIG. 6 is a schematic view of first embodiment of a laser system 100. FIGS. 7 and 8 illustrate respectively top and end views of the embodiment FIG. 6. In the embodiment illustrated in FIGS. 6-8, laser system 100 has a system housing 102 that encompasses, substantially encloses, or otherwise retains, a laser module 104, a drive circuit 106, a system controller 108, a user input system 110, sensors 112, a user output system 114, a communication system 116, and a power supply 118.

In this embodiment, system controller 108 receives signals from user input system 110, sensors 112, and communication system 114 and determines whether a response to such signals is required. When system controller 108 determines to respond to received signals by causing a laser emission, system controller 108 sends signals to drive circuit 106 causing drive circuit 106 to supply electrical energy from power supply 118 to laser module 104 in a manner that causes laser module 104 to emit a beam of collimated laser light 122. System controller 108 can also generate signals that cause user output system 114 to generate a human perceptible output. Additionally, system controller 108 can send signals to communication system 116 causing communication system 114 to send or other signals to other devices and can receive signals from communication system 116 from other devices. Power supply 118 provides electrical energy to drive circuit 106, control system 108, user input system 110, sensors 112, user output system 114, and communication system 116. Accordingly, system housing 102 encloses a stand-alone device capable of laser emission.

System housing 102 can be formed of any of a variety of rigid materials such as composites, laminates, plastics or metals. In one configuration, system housing 102 can be formed of an extruded aluminum, thereby providing sufficient strength without requiring significant weight while also providing good thermal transfer properties.

System housing 102 can be fabricated or assembled in any of a variety of ways. In one embodiment system housing 102 is machined such as by EDM (electrical discharge machining), assembled, or molded if composites, laminates, plastics or metals are employed for system housing 102. System housing 102 also can be fabricated using other conventional techniques including but not limited to additive assembly techniques.

In FIGS. 6-8, system housing 102 is shown having a generally cylindrical profile. However, in other exemplary embodiments, system housing 102 may be configured to mount to any of a variety of direct fire weapons such as handheld, side, and small firearms. Such firearms include, but are not limited to, pistols, rifles, shotguns, automatic arms, semi-automatic arms, rocket launchers and select grenade launchers and bows. In other embodiments, system housing 102 can be configured to mount any known dismounted or dismounted crew-served weapon, such as machine guns, recoilless rifles and other types of crew served weapons. In still other embodiments, system housing 102 can be shaped, sized or otherwise provided in forms that more readily interface with any of a variety of clamping or mounting mechanisms such as a Weaver-style or Picatinny rail or dove tail engagement for mounting to these firearms.

In other exemplary embodiments, system housing 102 can be configured as a component part of a firearm or other direct fire weapon, such as a foregrip, sight or stock.

Drive circuit 106 receives power from power supply 116 and control inputs from system controller 108. In response to the control inputs received from system controller 108, drive circuit 106 generates signals that cause laser module 104 to emit laser light. In the embodiment that is illustrated in FIG. 6 laser module 104 is not directly connected to power supply 118 but rather receives power by way of drive circuit 106 such that drive circuit 106 can control the time, duration, and intensity of electrical energy supplied to laser module 104. Drive circuit 106 may be configured to assist in tuning and/or otherwise controlling the output of laser module 104. Drive circuit 106 can be constructed to provide either pulsed or continuous operation of laser module 104. The rise/fall time of the pulse, compliance voltage and current generated by drive circuit 106 for the laser module 104 are selected to minimize power consumption and heat generation while achieving a desired beam intensity. These parameters may also be selected to cause laser module 104 to produce a beam having a desirable wavelength, frequency, and/or other quantifiable characteristics.

Depending on the desired output, drive circuit 106 can enable operation of the laser module 104 as a continuous or pulsed laser, such as by passive, active, or controlled switching. Although specific values depend upon the particular laser module 104 and intended operating parameters, it is contemplated the peak power draw of drive circuit 106 may be between approximately 1 amp and approximately 10 amps, with an average current draw between approximately 0.1 amps and approximately 1.0 amps. As the required voltage may be between on average approximately 9 volts and approximately 12 volts, approximately 0.9 W to approximately 12 W may be consumed. This may represent a substantial power consumption as well as heat generation.

In an exemplary embodiment, drive circuit 106 may assist in controlling and/or modifying the power level of laser module 104 to aid in penetrating components or conditions of the atmosphere through which laser system 100 will direct beam 122. Such components or conditions may include, for example, snow, rain, fog, smoke, mist, clouds, wind, dust, gas, sand, and/or other known atmospheric or airborne components. For example, drive circuit 106 can be configured to controllably, manually, and/or automatically increase the current and/or voltage directed to strengthen and/or intensify beam 122 emitted by laser module 104 in such conditions.

It is also understood that laser module 104 can have more than one semiconductor laser 180. In one exemplary embodiment of this type, a laser module 104 can have one semiconductor laser 180 in the form of a mid-range adapted infrared quantum cascade laser and another semiconductor laser 180 in the form of a long-range adapted infrared quantum cascade laser. Other combinations of semiconductor lasers 180 are possible.

Alternatively, in other embodiments, laser module 104 can include components that can receive signals from drive circuit 106 and that can adjust power supplied to laser module 104 in response to such signals. In such an alternative embodiment, laser module 104 may receive may receive electrical energy directly from power supply 118.

In the embodiment illustrated in FIGS. 6-8 system housing 102 has plurality of openings shown as openings 120, 124, 126 and 128. In certain embodiments, seals 140, 142, 144, 146 can be supplied to provide a barrier to resist entry of contaminants at openings 120, 124, 126 and 128 so as to protect the components disposed within system housing 102 from water, dust, vapors, or other harmful contaminants commonly experienced in non-controlled environment use. Optionally, system housing 102 can be hermetically sealed, at least in part around laser module 104.

User input system 110 includes human operable sensors such as switches, touch pads, joysticks, audio, video, keypads, key locks, proximity sensors or any other known types of sensors that can detect a user input action and that can provide signals to system controller 108 indicative of the user input action. In the embodiment of FIGS. 6-8, user input system 110 provides a switch 130 that takes the form of a four position mode switch with different settings to enable manual selection of three different operating mode selections and an off selection.

Sensors 112 can include any form of device that can be used to detect or otherwise sense conditions inside or outside of system housing 102 that may be useful to system controller 108 in determining actions to be taken in operating laser system 100. Sensors 112 can include without limitation, light sensors such as photovoltaic cells, contact switches, opto-electronic sensors such as light beam emitter and sensor pairs, electro-mechanical sensors such as limit switches, strain sensors, and proximity sensors such as Hall effect sensors, thermal sensors, meteorological sensors, such as humidity sensors, accelerometers, orientation sensors and other known sensors and transducers.

User output system 114 can include, without limitation actuators, light emitters, video displays, or other sources of human perceptible visual, audio or tactile signals from which a user can determine for example, and without limitation, a status of laser system 100, an operating mode of laser system 100, or that laser system 100 is emitting a laser beam 122 and a characteristics of the laser beam 122 that laser system 100 is emitting or will emit when instructed to do so. In this embodiment, user output system 114 includes a video display 132 that is positioned in opening 128.

Communication system 116 can include any combination of known communication circuits including wired or wireless transponders, transceivers, transmitters, receivers, antennas, modulators, de-modulators, encryption and de-encryption circuits or software and can provide other known components to facilitate data communication, the exchange of control signals or power exchanges in wired or wireless form.

Power supply 118 is shown located within system housing 102. In one configuration, power supply 118 comprises a battery and system housing 102 can include a battery compartment (not shown) sized to operably receive and retain a power supply 116 in the form of batteries. Depending upon the anticipated power requirements, available space, and weight restrictions, the batteries can be N-type batteries or AA or AAA batteries. Additionally, a lithium/manganese dioxide battery such as military battery BA-5390/U, manufactured by Ultralife Batteries Inc. of Newark, N.Y. can be used with laser system 100. The battery-type power supply can be disposable or rechargeable. Battery compartment can be formed of a weather resistant, resilient material such as plastic, and shaped to include receptacles for receiving one or more batteries or other power storage devices. Further, the battery compartment may be selectively closeable or sealable to prevent environmental migration into the compartment or to create a hermetically sealed environment therein.

In other exemplary embodiments, power supply 118 can take the form of a fuel cell, capacitive system or other portable electrical energy storage or generation system. It is understood that any type of power supply 118, preferably portable and sufficiently small in size can be utilized.

As is noted above, system controller 108 drives operation of laser system 100 and receives signals from user input system 110, sensors 112 and communication system 116 that system controller 108 can use to control operation of laser system 100. System controller 108 comprise for example a computer, a microprocessor, micro-controller, programmable analog logic device or a combination of programmable or hardwired electronic devices capable of performing the functions and actions described or claimed herein.

In the embodiment of FIGS. 6-8, system controller 108 determines a mode of operation of laser system 100 in response to a position of switch 130. When switch 130 is positioned in the "Off" position, user input system 100 sends signals to controller 104 causing system controller 108 to remain in an inactive state or can maintain a low power consumption mode of operation.

However, when system controller 108 receives signals from user input system 110 indicating that switch 130 has been moved to the "On" position system controller 108 can generate signals causing drive circuit 106 to drive laser module 104 to generate laser light. In other embodiments, switch 130 can comprise a switch that provides power to initiate operation of system controller 108 only when switch 130 is in a position other than the "Off" position.

Other modes of operation are possible. For example a "Stand By" mode of operation can be provided to conserve stored energy of from power supply 116 while maintaining the laser system 100 in an advanced state of readiness for use. For example, when sensor 130 is moved to the "Stand By" position user input system 110 can send signals to system controller 108 from which controller 108 can determine that this mode of operation has been selected.

In one embodiment, system controller 108 can detect that switch 130 has been moved to the "Stand By" position and can respond to this by sending signals to drive circuit 106 causing drive circuit 106 to begin supplying power circuits or subsystems, if any, that require some time to reach a state where they are ready for immediate activation when switch 130 is moved to the "On" position. Not all circuits or subsystems will need be activated at such times and a stand by option relieves the operator from being confronted with the choice of operating the laser system 100 in a high power consumption "On" mode prior to the need to do so and the choice of holding the device in the "Off" state to conserve power with the understanding that there will be a lag time before activation.

Additionally, in the embodiment of FIGS. 6-8 switch 130 can be positioned at a location that indicates that laser system 100 is to be operated in a "Test" mode. In one example of this type system controller 108 can cause laser module to emit a lower powered laser beam 122. This lower powered laser beam can 122 be used to allow verification of the operational status of laser system 100 such as by emitting a lower powered laser test beam that can be directed at, for example, nearby targets for training purposes or at target strips or pages that change in appearance when illuminated by the laser in the test mode. Here too, this mode will be entered when system controller 108 receives a signal from user input system 110 indicating that switch 130 has been moved to a position selecting the "Test" mode.

Figure 9:
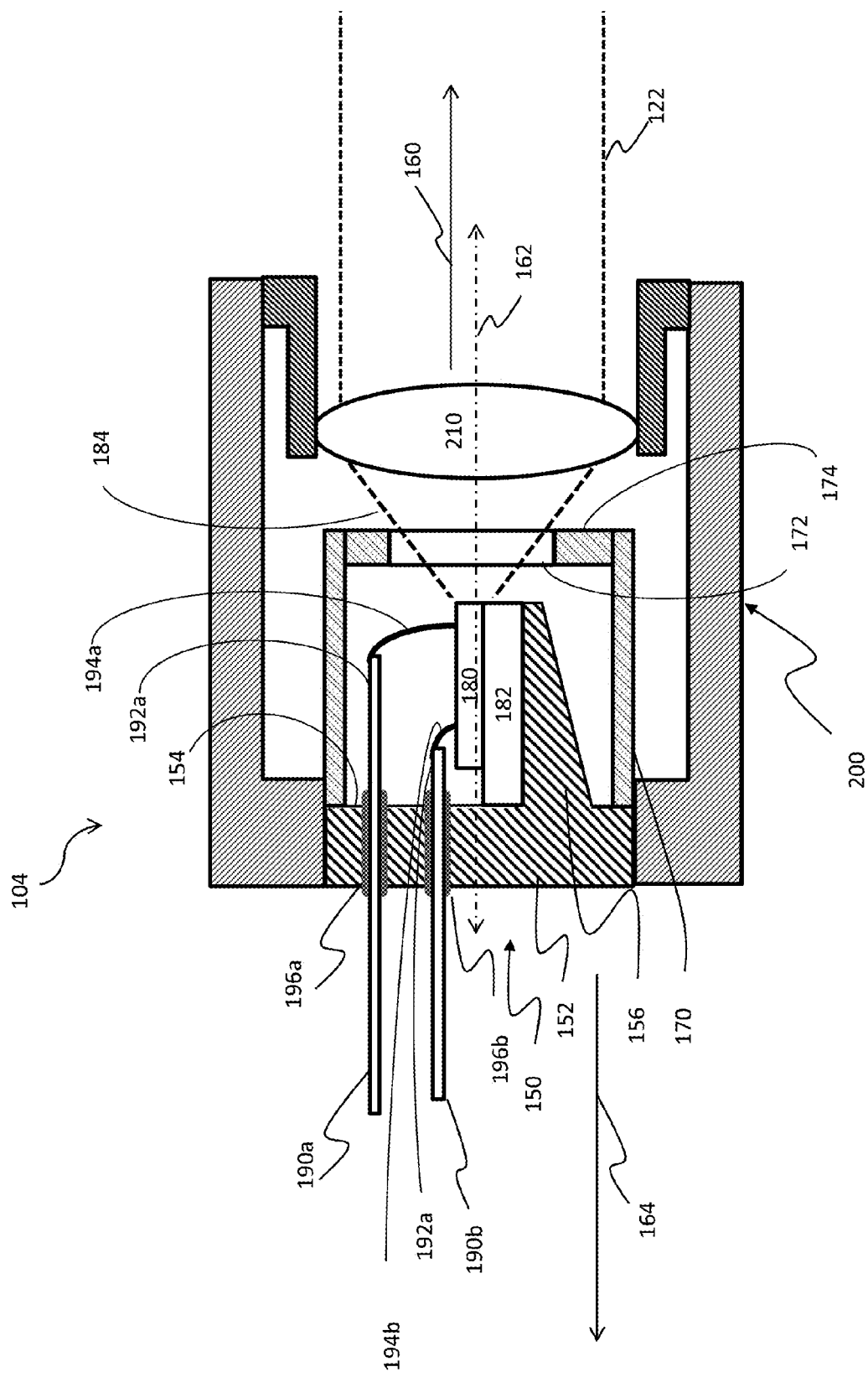
FIG. 9 is cross-section view of one embodiment of a laser module.

Turning now to FIG. 9 what is shown is a cross-section schematic view of one embodiment of a laser module 104. In the embodiment that is illustrated in FIG. 9, laser module 104 has an enclosure 150 with a base 152 having a front side 154 from which a header 156 extends in a first direction 160 and a housing 170 shaped to combine with front side 154 to form a sealed environment about header 156.

A semiconductor laser 180 is mounted to header 156. In this embodiment, semiconductor laser 180 is mounted to header 156 by way of a submount 182 and is positioned to direct a divergent laser beam 184 in first direction 160 through a window 172 on a front portion 174 of housing 170. Semi-conductor laser 180 or submount 182 can be joined to header 156 in any of a variety of ways including conventional fasteners, solders, conductive adhesives and the like. Semiconductor laser 180 in turn is typically bound to submount 182 using soldering techniques, although other techniques are also known.

Semiconductor laser 180 can comprise for example, any semiconductor device that can emit a laser output. Examples of semiconductor laser 180 include but are not limited to a diode laser, quantum cascade lasers, inter-band cascade lasers. These types of semiconductor lasers 180 share generally the characteristics of being made from a semiconductor material and having a emitting a divergent laser light beam while also generating a meaningful amount of heat that must be dissipated to protect semiconductor laser 180.

In the embodiment illustrated in FIG. 9, semiconductor laser 180 emits a divergent laser light 184 having a wavelength in the infrared region such as between 2μ and 30μ wavelength. However, in other embodiments, semiconductor laser 180 can emit a divergent laser light 184 having any of a wide range of wavelengths including but not limited to ultraviolet wavelengths, visible wavelengths, and near infrared wavelengths. For the purposes of the following discussion, it will be assumed that in the embodiment of FIG. 9, semi-conductor laser 180 is a quantum cascade type laser.

In the embodiment shown in FIG. 9, a plurality of conductors 190a and 190b are connected at first ends 192a and 192b thereof to semiconductor laser 180 by way of individual wire bonds 194a and 194b. Conductors 190a and 190b pass through base 152 through non-conductive sealed openings 196a and 196b in base 152 and extend in a second direction 164 that is opposite first direction 160.

It will be appreciated that in some embodiments different number of conductors 190 can be used. Typically, each conductor 190 has at least one wire bond 194 that is used to supply power to heat emitting laser 180. For the purposes of clarity, only two are shown here. In other embodiments, more than one conductor 190 may be used. Additional connectors may be used to allow signals to pass to and from components within the enclosure formed by base 152, housing 170 and window 172. This can be used for example to allow drive circuit 106 or system controller 108 receive signals from a sensing device such as a thermistor or other heat sensor or a photosensor so that driver circuit 106 or controller 108 can determine the temperature near semiconductor laser 180 or the light output of semiconductor laser in order to enable feedback/control purposes. In still other embodiments, additional conductors 192 can be used as necessary to provide additional sensing, control, or power paths into and out of the enclosure made between base 152, housing 170 and window 172.

A frame 200 is joined to base 152 and extends from base 152 past window 172 to position a lens 210 at a distance along axis 162 from semiconductor laser 180. In operation, semiconductor laser 180 generates a divergent laser beam 184 which is directed toward lens 210. Lens 210 collimates the divergent laser beam 184 from laser 180 into a collimated laser beam 122 when positioned at a location where lens 210 can effectively focus light from laser 180. As used herein a collimated laser beam 122 includes a laser beam that is fully collimated as well as laser beams having substantial collimation with a limited allowable divergence.

In general, lens 210 can provide a high degree of collimation of divergent laser light if held at its focal distance from semiconductor laser 180. However, in practical use this is difficult to achieve with a static lens mounting design. In particular it will be understood that a variety of forces can conspire to influence the distance that a mechanical system such as frame 200 will position lens 210. Chief among these are the forces of thermal expansion and contraction which can cause significant changes in the length of components of frame 200 and the resultant position of lens 210 relative to semiconductor laser 180.

Accordingly, frame 200 is of an athermalized design meaning that frame 200 is designed so that frame 200 will hold lens 210 in a desirable range of positions relative to semiconductor laser 180 despite any thermal expansion or contraction of any components of frame 200 that may arise during transport and operation of laser system 180. Such systems do not seek to completely resist or prevent heating or cooling of frame 200, but rather are defined to provide mechanisms to allow for automatic compensation for any thermal expansion caused by such heating or cooling.

Figure 10:
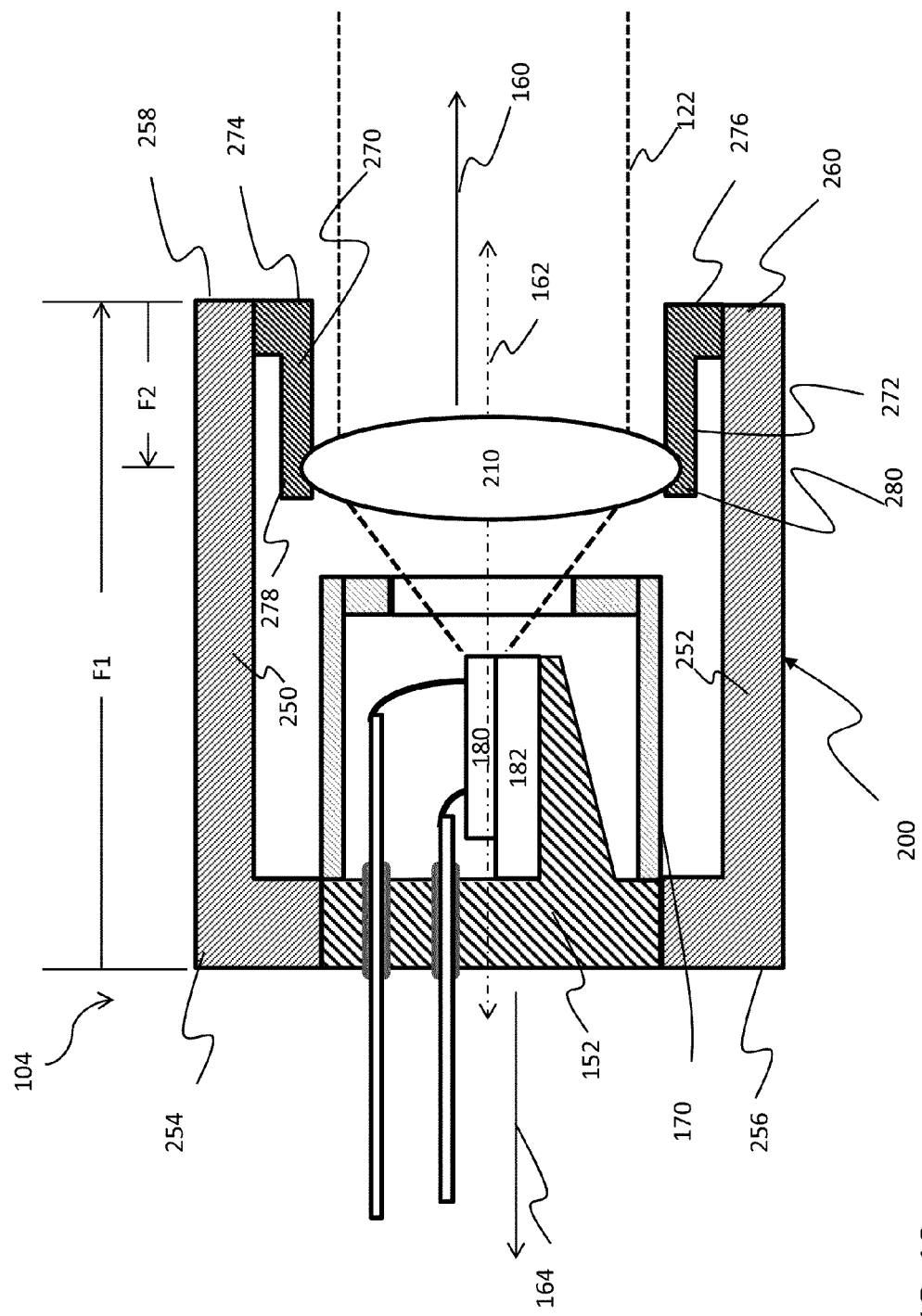
FIG. 10 illustrates the operation of a laser module having an embodiment of an athermalized frame.
Figure 11:
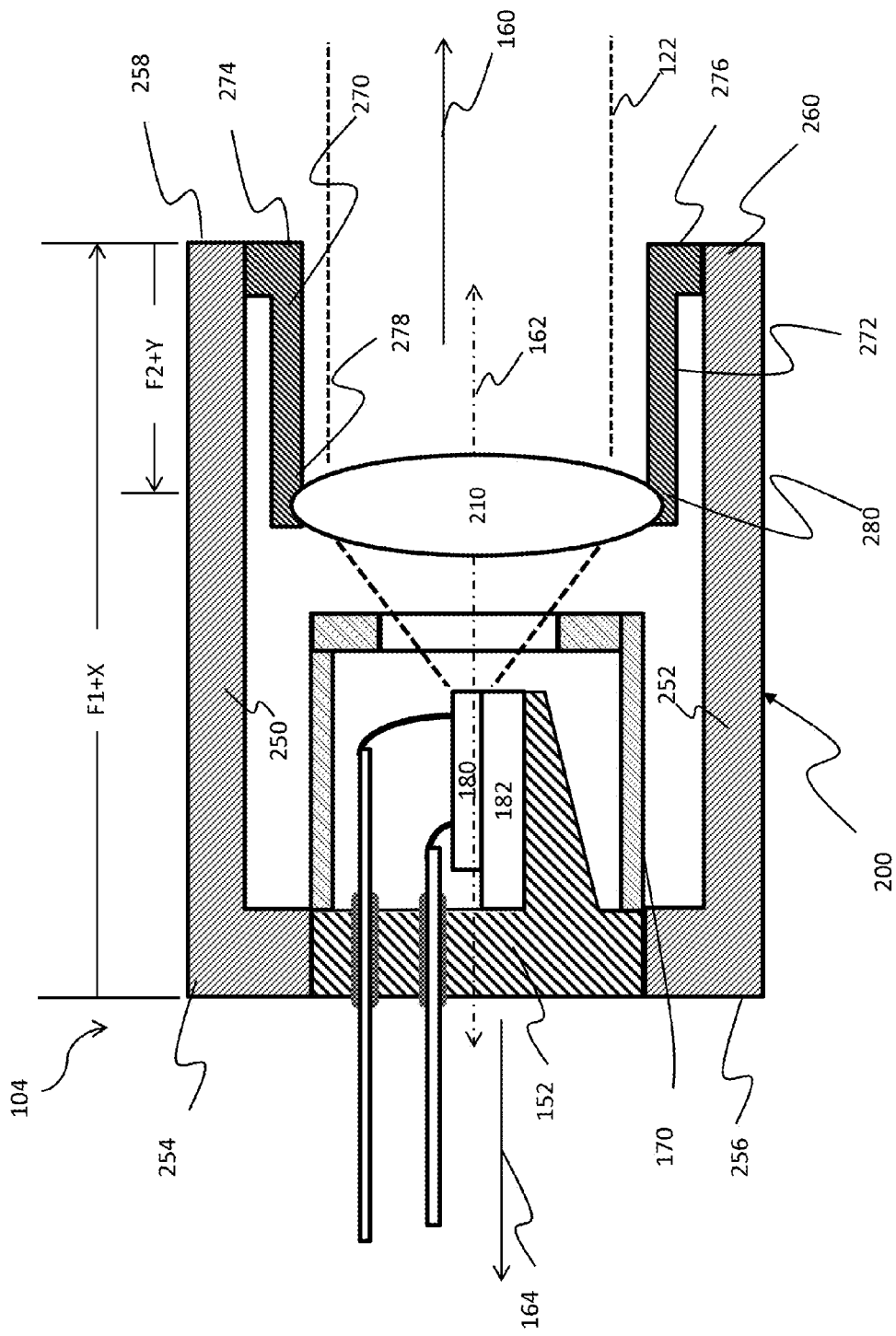
FIG. 11 illustrates the operation of a laser module having an embodiment of an athermalized frame.
Figure 12:
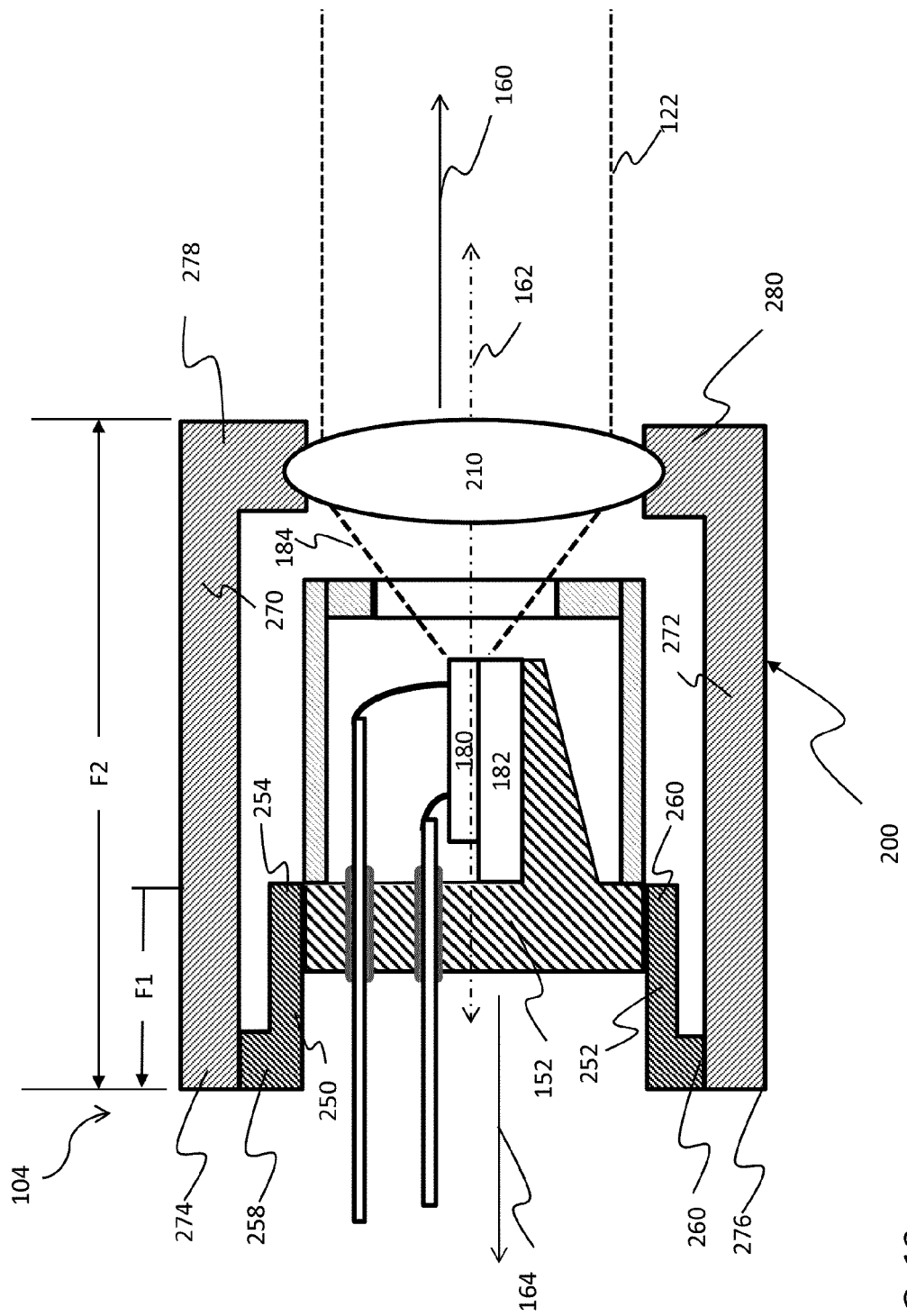
FIG. 12 illustrates the operation of a laser module having an embodiment of an athermalized frame.

FIGS. 10-12 illustrate the operation of a laser module 104 having an embodiment of an athermalized frame 200. As is shown in these FIGS. 10-12 frame 200 is provided in segments that are positioned, anchored and/or linked to allow thermal expansion of materials in frame 200 but that are arranged so that different segments of frame 200 create offsetting effects when exposed to a given thermal stimulus.

As is shown in FIG. 10, frame 200 has first frame segments 250 and 252 having anchor ends 254 and 256 and movable ends 258 and 260, respectively. To simplify the following discussion it will be assumed that first frame segments 250 and 252 are formed from materials having a common coefficient of thermal expansion and are shaped and assembled in a common manner so that a common distance is between base mounting ends 254 and 256 and movable ends 258 and 260, respectively at any given temperature level. However, in other embodiments these characteristics of first frame sections 250 and 252 can vary according to the needs of such embodiments.

In the embodiment that is illustrated in FIG. 10, base mounting ends 254 and 256 are shown connected directly to base 152. In other embodiments, base mounting ends 254 and 256 can be connected to base 152 by way of intermediate structures such as system housing 102 or other structures not shown including but not limited to a heat spreader or a thermoelectric cooler.

As is also shown in FIG. 10, frame 200 has second frame sections 270 and 272 having frame mounted ends 274 and 276 and lens movable mountings 278 and 280, respectively.

To simplify the following discussion it will be assumed that second frame sections 270 and 272 are formed from materials having a common coefficient of thermal expansion and are shaped and assembled in a common manner so that a common distance is between frame mounted ends 274 and 276 and lens mounted ends 276 and 278 respectively at any given temperature level. However, in other embodiments characteristics of second frame sections 270 and 272 can vary according to the needs of such embodiments.

FIG. 10 illustrates frame 200 at a nominal temperature. It will be appreciated from FIG. 10 that first frame segments 250 and 252 are arranged in a first direction 160 extending away from base 152 along axis 162 by a distance F1. Second sections 270 and 272 have frame mounted ends 274 and 276 that extend therefrom in second direction 164 to lens mountings 278 and 280 by a distance F2. Accordingly, the position of lens 210 is determined in part by the difference between F1 and F2 and in this embodiment lens 210 frame segments 250, 252, 270 and 272 are defined to hold lens 210 at a focal length of lens 210 from semiconductor laser 180 when laser module 104 is at a nominal temperature.

FIG. 11 illustrates laser module 104, frame 200 and lens 210 at an elevated temperature range. At this elevated temperature range, the distance F1 is greater by a first thermal expansion distance X. The amount of first thermal expansion distance X is determined by the distance F1, a coefficient of thermal expansion first frame segments 250 and 252 and a difference in temperature between the nominal temperature and the elevated temperature. In FIG. 11, thermal expansion of first frame sections 254 and 256 at movable ends 258 and 260.

However, the distance F2 is also increased by a thermal expansion distance Y in second direction 164. The thermal expansion distance Y is determined by the distance F2, the coefficient of thermal expansion of second frame segments 270 and 272 and the difference in temperature between the nominal temperature and the elevated temperature.

As can be seen in FIG. 11, first frame segments 250 and 252 and second frame segments 270 and 272 are defined so that at this elevated temperature the difference between X and Y is equal. This can be done by defining the length of along axis 162 of that first segments 250 and 252 and second segments 270 and 272 extend and by selecting combinations of materials having coefficients of thermal expansion for use in first segments 250 and 252 and second segments 270 and 272 such that thermal expansion of first segments 250 and 252 will be offset by the thermal expansion of second segments 270 and 272 at predetermined thermal range limits. It will be appreciated that in some embodiments, frame 200 operates in a manner that is generally the converse of that illustrated in FIG. 11 when laser module 104 is used in at temperatures that are below the nominal temperature of FIG. 10.

This approach can also require that first frame segments 250 and 252 are made so that they expand in a first direction 160 at a rate that matches a rate of expansion of second frame segments 270 and 272 over the range of temperatures experienced by laser module 104. This is a particular concern for laser systems 100 that may be called upon to operate in conditions where ambient temperatures are constantly changing or can quickly change over the course of minutes or seconds, such as where laser system 100 is used in aircraft which can experience rapid ambient temperature changes during flight or where laser system 100 is a hand held device that can be carried in the inside of a jacket and then removed for use in cold weather.

In such situations, laser system 100 should have a frame 200 that is capable of rapidly adapting to ambient conditions and the choice of materials for use in frame 200 must consider the rate at which different segments of frame 200 will adapt to thermal transitions. This involves consideration of the ability of the segments of frame 200 to receive and absorb thermal energy from the environment. A number of factors can influence this. The first is the overall rate at which a material in the segments of a frame 200 can absorb or release thermal energy in order to cause a change in length. This can be driven by the rate at which a material forming a segment can absorb or release heat and by the available surface area through which heat can be transferred into or out of the frame segment. For example, some polymeric materials expand significantly when heated but only absorb heat at a rate that is substantially slower for example than metals. Similarly, the extent to which each frame segment is directly exposed to ambient thermal conditions will influence the rate at which each frame segment heats and thermally expands.

The rate of thermal expansion can also be driven by the mass of material in each segment that must be heated or cooled to affect a given unit of change per unit of time. Frame segments having large material masses, all other things being equal, will require longer heating and expansion times than frame segments having lower masses.

In the embodiment illustrated in FIGS. 10 and 11 selection and design of first frame segments 250 and 252 and second frame segments 270 and 272 have been made such that the position of lens 210 can be held with a high degree of accuracy over a useful range of temperatures and without active cooling of frame 200.

However, the challenge associated with providing first frame segments 250 and 252 and second frame segments 270 and 272 that provide offsetting expansion distances over a range of temperatures can be daunting, particularly where there is little time for thermal adjustment. It will be appreciated that in some cases the extent of a range of positions over which a lens can be moved while providing a laser beam having a divergence that is within a predetermined limit will dictate the extent to which various embodiments of such a solution can be provided in a cost effective, efficient and effective manner.

In the embodiments described above, anchor ends 254 and 256 of frame 200 are linked to base 152 directly and at a point along axis 162 that is behind laser 180. Accordingly, to the extent that thermal expansion can cause materials that form structures between anchor ends 254 and 256 of frame 200 and semiconductor laser 180 to expand, such expansion will also operate to reduce the relative separation of semiconductor laser 180 and lens 210 and can be incorporated into the overall athermalization planning for laser module 104. In some cases this may allow for a modest reduction in the required length of second frame segments 270 and 272.

In some cases, the materials forming lens 210 may themselves be impacted by temperature. This can occur for example where the refractive index of materials in lens 210 changes as a function of temperature. This can also occur for example where the shape of lens 210 changes as a function of temperature. In some cases, both of these effects can occur.

One effect that these changes in lens properties can have is to change the focal length of lens 210 as a function of temperature. Where this occurs, any such changes should be considered in designing frame 200 such that athermalization features of frame 200 cause lens 210 to remain in a position where lens 210 can convert divergent laser light 184 into a laser beam 122 having a predetermined extent of divergence.

FIG. 12 illustrates a further embodiment of a frame 200 having athermalization features. FIG. 12 illustrates frame 200 at a nominal temperature. It will be appreciated from FIG. 12 that in this embodiment first frame segments 250 and 252 are arranged in a second direction 164 extending away from base 152. Second sections 270 and 272 have frame mounted ends 274 and 276 that are joined to movable ends 256 and 258 of first frame segments 250 and 252 and extend therefrom in first direction 160 to lens mountings 278 and 280.

Accordingly, the position of lens 210 is determined in part by the difference between F1 and F2 and in this embodiment lens 210 frame segments 250, 252, 270 and 272 are defined to hold lens 210 at focal length of lens 210 from semiconductor laser 180 when laser system 100 is at a nominal temperature and to expand or contract in response to thermal stimulus such that lens 210 is held to achieve a desired collimation of laser light from lens 210.

In some laser systems 100, an advantage of the embodiment of frame 200 of FIG. 12 is that a smaller length of laser module 104 is required to extend past laser 180 thus enabling a more compact laser module 104 or laser system 102.

It will be appreciated from the foregoing that athermalization strategies can be particularly useful in helping to achieve improvements in the performance of laser system 100 by reducing or eliminating the extent to which lens positions varies as a function of temperature. However, it will also be appreciated that with each additional demand placed on an athermalization system by the optical system, the laser system, and the expected use case of the laser system, the more complicated and difficult providing an effective athermalized system can be. Alternatives such as providing climate control capabilities for optical systems present the additional problems described above.

It is therefore necessary to consider a different approach to this problem, one that allows for greater system level tolerance of the sources of system variation. Additionally, is desirable to address the needs for laser module systems that can be more readily adapted and more readily incorporated into systems that are adapted for use in specific applications.

The present inventors have discovered that contrary to the preferences of the prior art, smaller more portable laser systems can be provided that advantageously offer that can generate laser beams having a desired collimation without resort to the smaller lenses preferred for such systems in the prior art.

Accordingly, lens 210 has a focal length of greater than 10 mm. Preferably, lens 210 has a numerical aperture that corresponds to an extent of divergence of the divergent laser light 184 from semi-conductor laser 180. For example, a lens 210 for use with a quantum cascade type of semiconductor laser 180 that emits a divergent laser light 184 can have a numerical aperture of at least 0.6.

Figures 13A, 13B:
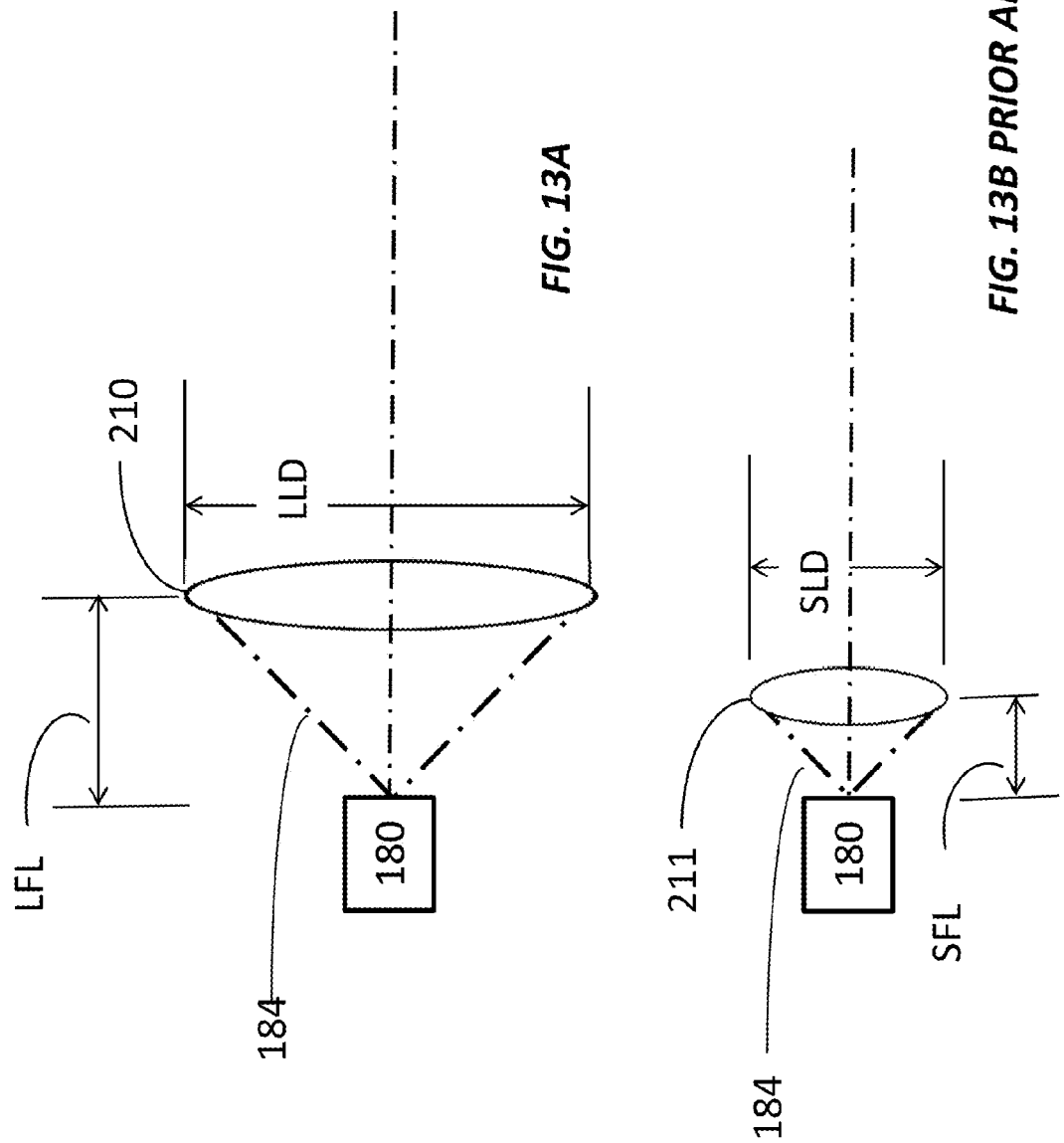
FIG. 13A illustrates an embodiment of one embodiment of a lens.
FIG. 13B illustrates an embodiment of an alternative smaller focal length lens of the prior art.

FIGS. 13A and 13B illustrate an example embodiment of lens 210 and an alternative small focal length lens 211 preferred in the prior art. In this example, both lenses have an input side to receive divergent laser light such as divergent laser light 184 and are intended to provide an output beam of infrared light having no more than a threshold level of divergence. Additionally, for the purpose of simplifying the following discussion, lens 210 and alternative smaller focal length lens 211 are assumed to have the same numerical aperture.

However, lens 210 and alternative smaller focal length lens 211 differ from each other in at least two respects, lens 210 has a larger focal length LFL that for the purposes of the following discussion is twice the smaller focal length SFL of alternative smaller focal length lens 211 and lens 210 has a larger lens diameter LLD that is twice the diameter of a smaller lens diameter SLD of alternative smaller focal length lens 211.

Figure 14:
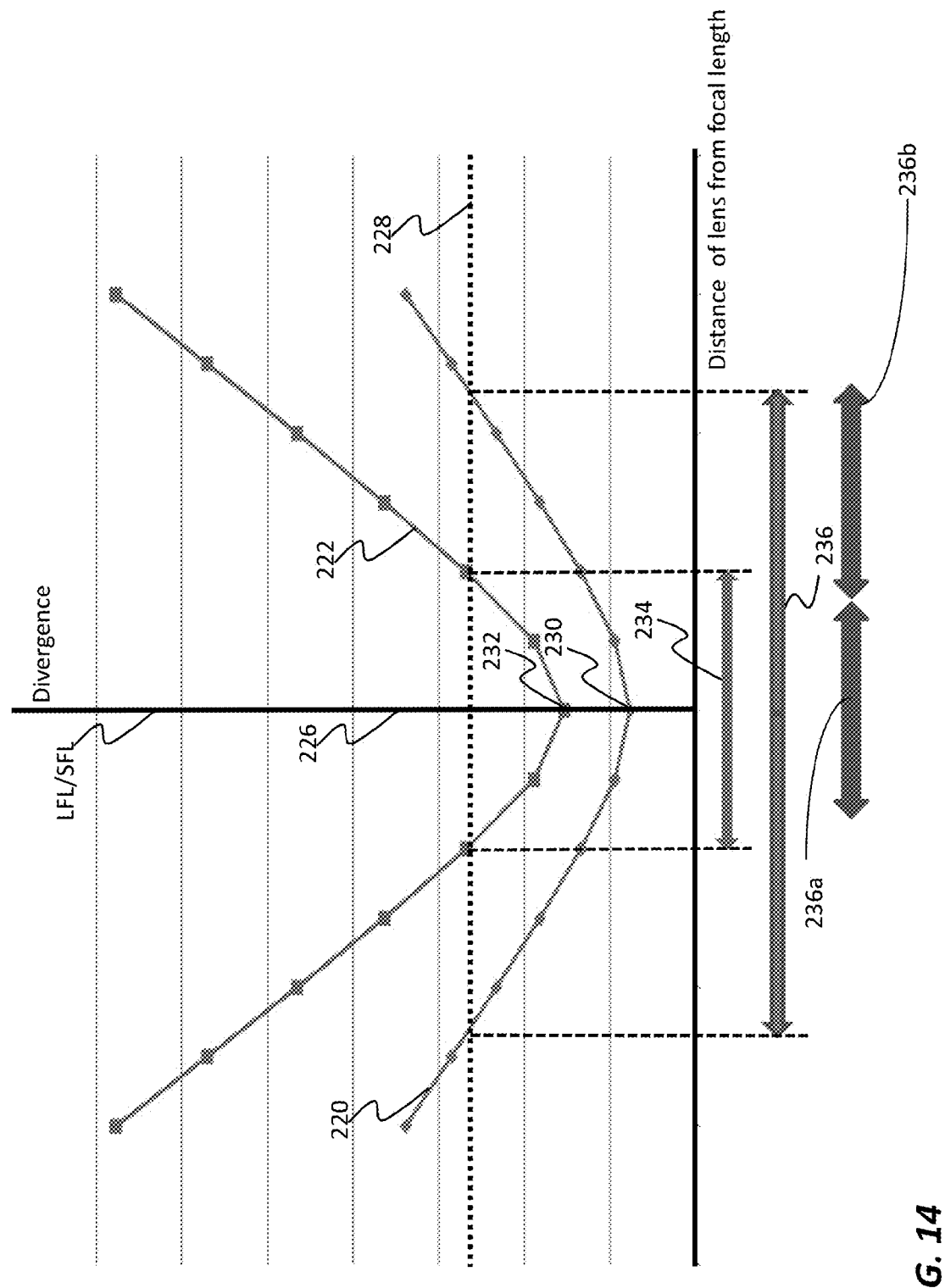
FIG. 14 is an X-Y chart depicting a first plot of the divergence of a beam from lens and a second plot of the divergence of a beam from smaller focal length lens when lens and smaller focal length lens are exposed to identical divergent beams of infrared laser light from a semiconductor laser.

FIG. 14 is an X-Y chart depicting a first plot 220 of the divergence of a beam from lens 210 and a second plot 222 of the divergence of a beam from smaller focal length lens 211 when lens 210 and smaller focal length lens 211 are exposed to identical divergent beams of infrared laser light 184 from a semiconductor laser 180. In the chart of FIG. 14, plots 220 and 222 are plotted with reference to a Y-axis representing an extent of divergence in a beam exiting from larger lens 210 and smaller focal length lens 210 and with reference to an X-axis representing positions of larger lens 210 and alternative smaller focal length lens 211 relative their respective focal lengths.

In FIG. 14, the intersection of first plot 220 with centerline 226 represents the divergence of a beam of infrared light emitted by lens 210 when lens 210 is separated from the quantum cascade type semiconductor laser 180 by the larger focal length LFL. Similarly, the intersection of second plot 222 with centerline 226 represents divergence of the beam exiting from smaller focal length lens 211 when smaller focal length lens 211 is separated from a semi-conductor laser 184 by the smaller focal length SFL.

As can be seen from the intersection of first plot 222 with centerline 226, when smaller focal length lens 211 is positioned apart from semiconductor laser 180 by smaller focal length SFL, smaller focal length lens 211 focuses the divergent laser light into a beam having a low divergence 232. As can be seen from the intersection of second plot 220 with centerline 226, when larger lens 210 is positioned at larger focal distance LFD from semiconductor laser 180, lens 210 focuses divergent laser light into a beam having a lower divergence 230.

It will be appreciated from FIG. 14, that even when lens 210 and smaller focal length lens 211 are positioned at their respective focal distances relative to semiconductor laser 180, smaller focal length lens 211 emits a beam having a greater divergence than the beam emitted by larger lens 210. Accordingly, one benefit of lens 210 is that lens 210 is more capable of generating a beam with lower divergence.

As is shown in plot 222 in FIG. 14, the divergence of the beam from smaller focal length lens 211 rapidly increases when smaller focal length lens 211 is moved in ways that cause the distance between semiconductor laser 180 and smaller focal length lens 211 to be greater than or less than the smaller focal length SFL.

In contrast, as can be seen from plot 220, the divergence of the beam that is emitted by lens 210 increases at a much more gradual rate when larger lens 210 is moved in ways that cause the distance between the quantum cascade laser 180 and lens 210 to be greater than or less than the larger focal distance LFD of lens 210.

Assuming, a hypothetical limit 228 on the preferred level of divergence of a laser beam 122 that is emitted by laser system 122, lens 210 can collimate divergent laser light 184 into a collimated beam 122 having less than a predetermined divergence when lens 210 is positioned within a range of positions 236 about larger focal length LFL. In contrast, an alternative smaller focal length lens 211 must be held within a smaller range of positions 234 around smaller focal length SFL.

In the chart of FIG. 14, the larger range of positions 236 is almost twice the size of a smaller range of positions 234 within which smaller focal length lens 211 can be positioned while still providing a beam having no more than a the preferred level of divergence. In other embodiments the difference between the sizes of the large range of positions and the small range of positions can be larger or smaller than the difference illustrated. For example, and without limitation in one embodiment, the large range of positions 236 can be about 50% larger than the size of the smaller range of positions 234.

In sum, through the use of a lens 210, having a focal length of greater than 10 mm the risk that forces causing variations in the position of lens 210 relative to semiconductor laser 180 will impact the performance of laser system 100 is substantially lowered as compared to the extent of such risk when smaller focal length lens 211 of the type preferred by the prior art is used.

Additionally, when designing a laser system 100 using an alternative smaller focal length lens 211, care must be taken to ensure that smaller focal length lens 211 is carefully manufactured within the small range of positions 234 relative to semiconductor laser 180.

In contrast the use of a lens 210 helps to prevent or reduce many of the non-thermal causes of lens mis-positioning. For example, lenses 210 can have diameters on the scale of 20 mm or more and are easier for assembly personnel to manipulate and for equipment to handle and therefore can be assembled into a laser system 210 with increased reliability.

A further advantage available in laser system 100 that includes a lens 210 is that lens 210 will be positioned at a longer distance from a semi-conductor laser than an alternative smaller focal length lens 211. Accordingly, there is greater opportunity for transient heat that is generated by a semiconductor laser 180 to be dissipated before such heat begins to have a significant impact on lens 210. This reduces the possibility that thermal gradients will form in lens 210 that are sufficient to distort the shape of lens 210 in ways that introduce divergence into laser beam 122, that steer laser beam 122 away from a desired direction or that introduce other undesirable effects.

Similarly, the use of lens 210 provides a greater opportunity for heat that is generated by semiconductor laser 180 to be dissipated before such heat can cause significant sufficient thermal expansion of components of frame 200 to move lens 210 to a position where lens 210 can no longer provide the desired extent of collimation of divergent laser light 184. In part, this greater opportunity arises because of the greater length of frame 200 all that must be heated to induce a significant change in the position of lens 210 relative to semiconductor laser 180 and in part this occurs because there is a greater opportunity for such heat to be dissipated before changing the length of frame 200.

In other embodiments further advantages are possible. For example, the size, weight, complexity or cross-sectional area of frame 200 can be reduced through the use of lens 210. In one example of this, at least one of the size, weight, or cross-sectional area of a frame 200 can be made lower can be made lower than a respective size, weight, or cross-sectional area of an alternative system housing having an alternate frame that holds an alternative lens in the second range of positions over first range of temperatures 236.

This can occur for example because an alternative lens frame that can hold an alternative smaller lens within a smaller range of positions and therefore frame 200 must impose a greater extent of control over the position of the alternative smaller lens 211. Such additional control can in some cases require a larger number of components because such a lens frame has components that require more complex interactions such as lens frames that that have multiple interactions between moving parts, or because such an alternative frame must be composed in a manner with more complex structures or structural interactions to provide much tighter controls over the extent of expansion.

In still another example, a frame 200 that positions lens 210 so that frame 200 holds lens 210 within a first range of positions (shown in FIG. 14 as 236a) of the first range of positions 236 over a first range of temperatures may also be capable of holding lens 210 so that frame 200 positions lens 210 within a second portion (shown as 236b in FIG. 14) of the first range of positions 236 at temperatures that are higher than the first range of temperatures.

In contrast an alternative frame facing a similar temperature range will still be required to position an alternative smaller focal length lens 211 within the smaller range of positions 234. Where this occurs, at least one of the size, weight, complexity or cross sectional area of such an alternative frame must be increased beyond that which is used to confine the smaller lens within smaller range of positions 234 over the first range of temperatures. Accordingly, at least one of the size, weight, complexity or cross-sectional area of a frame 210 will be lower than a respective size, weight, complexity or cross-sectional area of an alternative frame that holds an alternative small lens in the first range of positions over the second range of temperatures 234.

That is, an alternate frame for an alternative smaller focal length lens 211 has a difficult task in confining smaller focal length lens 211 within the smaller range of positions 234 over a first temperature range. The challenge associated with holding smaller focal length lens 211 within the smaller range of positions 234 increases greatly as the range of temperatures over which smaller lens 211 operates increases and places additional demands on the frame to be used with the smaller lens 211, thereby requiring changes that increase size, complexity, weight and cross sectional area of such an alternative frame to the point where other options such as actively cooling the frame as is described in the '806 patent or limiting the duty cycle of the laser as is described in the '094 patent must be considered.

Additionally, in some embodiments, at least one of the size, weight, complexity or cross sectional area of a system housing 102 having a frame positioning larger lens 210 within the larger range of positions is lower than a respective size, weight, complexity or cross-sectional area of an alternative system housing having a frame that holds an alternative lens 211 in the smaller range of positions 234 over the first range of temperatures.

Figure 15:
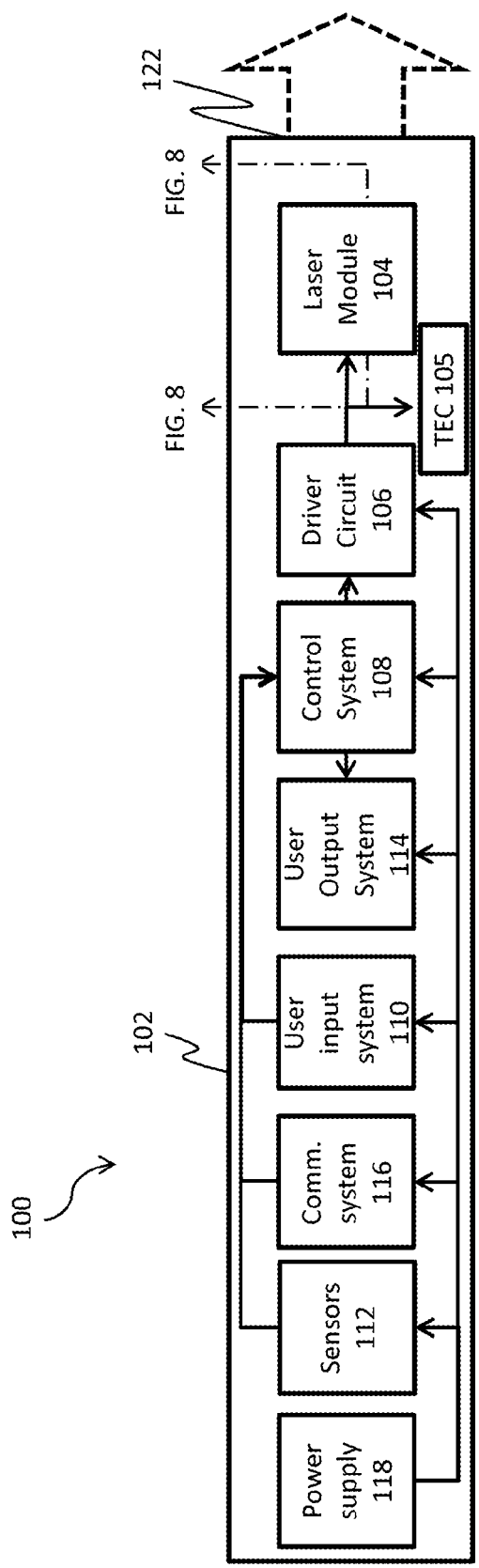
FIG. 15 illustrates an embodiment of a laser system that provides an optional thermoelectric cooling system.

In other embodiments, the use of lens 210 can reduce power consumption requirements for laser system 100. One example of this is illustrated with reference to FIG. 15 in which an embodiment of laser system 100 provides an optional thermoelectric cooling system 105 that is operated, in this embodiment, by drive circuit 104 to limit the extent to which any heat generated by operation of the semiconductor laser heats frame 200 and lens 210. In such embodiments, the duty cycle of the thermoelectric cooling system 105 is lower in a laser system 100 having lens 210 than in an alternate laser system having alternate smaller focal length lens 211 during an equivalent amount of laser usage. This can occur because even small amounts of uncompensated thermal expansion of an alternate frame holding a smaller focal length lens 211 can allow smaller focal length lens 211 to drift out of second range 234 thereby requiring a greater level of thermal stability and more usage of thermoelectric cooling system 105 as compared to an extent of usage of thermoelectric cooling system 105.

In some embodiments of this type a lower duty cycle of laser system 100 having lens 210 places lower power requirements on power supply 118 enabling power supply 118 to be smaller than a power supply required by the lower duty cycle of laser system 100 having lens 210 places lower power requirements on the power supply enabling the power supply to be smaller than a power supply in an alternate system having a smaller laser lens for an equivalent level of laser output.

Figure 17:
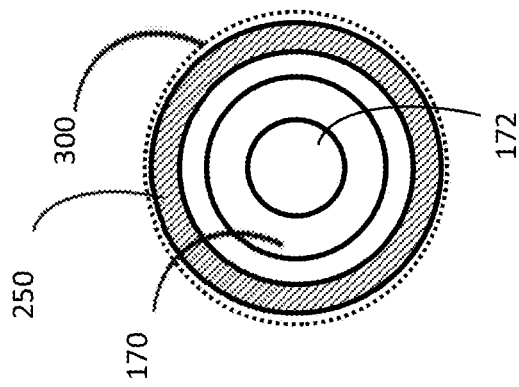
FIG. 17 is a cross-section view of the embodiment of FIG. 16.
Figure 16:
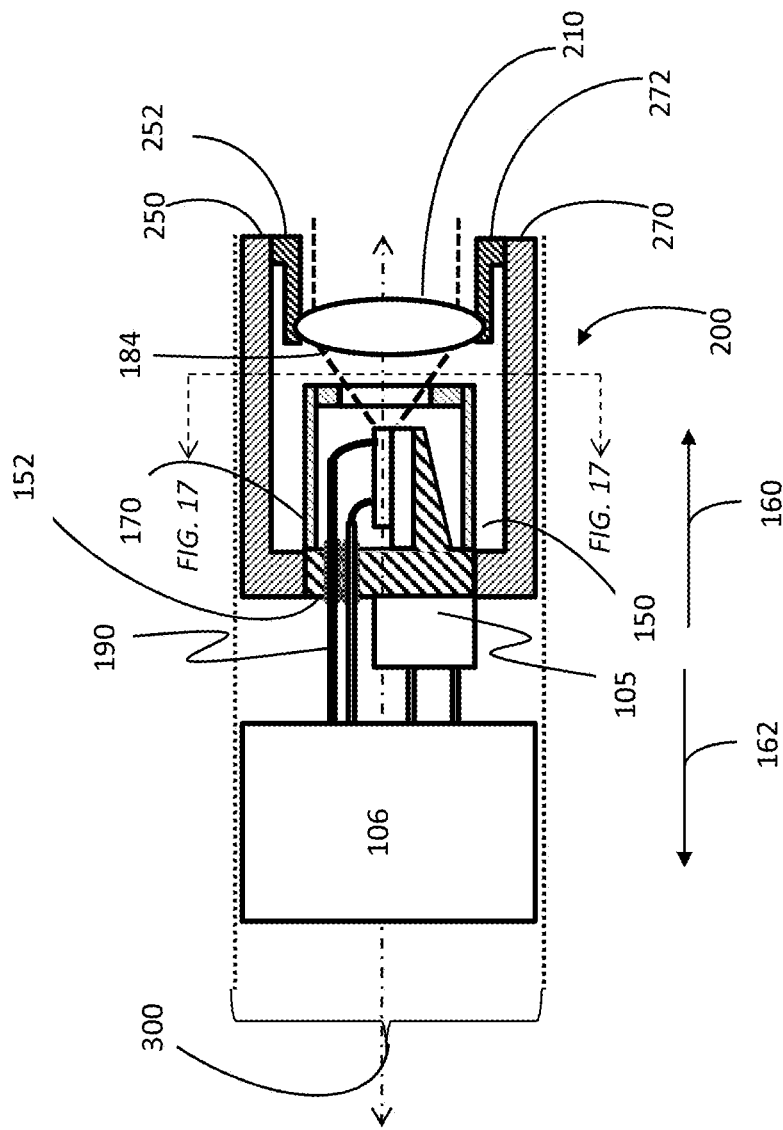
FIG. 16 is a cross-section view of another embodiment of a laser module.

FIGS. 16-19 illustrate examples of the use of laser modules 104 in laser systems 100 of FIGS. 6-8. As is shown in a side schematic view in FIG. 16 and as a cross-section view in FIG. 17 frame 200 is joined to base 152 and first segments 250 and 270 of frame 200 and extends in first direction 160 from base 152 and combine with second sections 252 and 272 respectively to position lens 210 in the divergent laser light 184 at a position that causes a laser beam 122 having a limited divergence to emit therefrom. As is shown in FIGS. 16 and 17, in this embodiment base 152 and housing 160 are positioned within a cross-sectional area 300 of frame 200 and lens 210.

As is also shown in FIGS. 16 and 17, a plurality of conductors 194 extend through base 152 in second direction 164. Conductors 190 provide electrical connections to allow current to flow through the semiconductor laser 180. In the embodiment illustrated here, conductors 194 extend to driver 106 which operates generally as described above to supply electrical energy that causes divergent laser light 184 to be emitted and focused into laser beam 122 by lens 210.

Base 152 and housing 170 are sized and positioned for location within a cross sectional profile of frame 200 and lens 210 however, base 152 and housing 170 need not occupy the entire cross-sectional area or even a substantial proportion thereof. In exemplary embodiments, it is sufficient that base 152 and housing 170 are within a cross-sectional profile of frame 200 and lens 210. For example, base 152 and housing 170 can be sized and positioned for location within a cross-sectional diameter that is at least large enough to hold frame 200 and lens 210.

In one embodiment, base 152 and housing 170 are sized and positioned for location within a predetermined cross-sectional area having at least about 275 sq. mm. In another embodiment, base, housing, the frame and the lens are frame are sized and positioned within a predetermined cross-sectional area of between 275 and 600 square millimeters.

Figure 19:
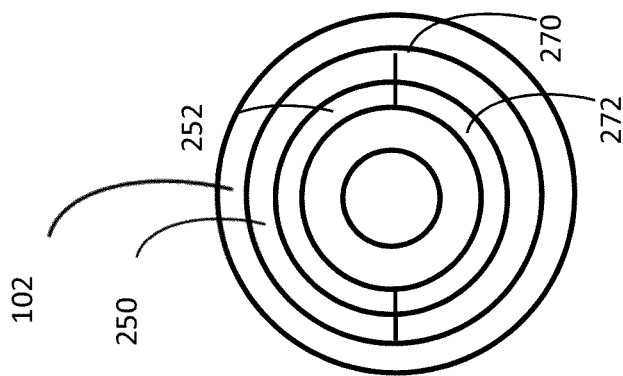
FIG. 19 is an end view of the embodiment of FIG. 18.
Figure 18:
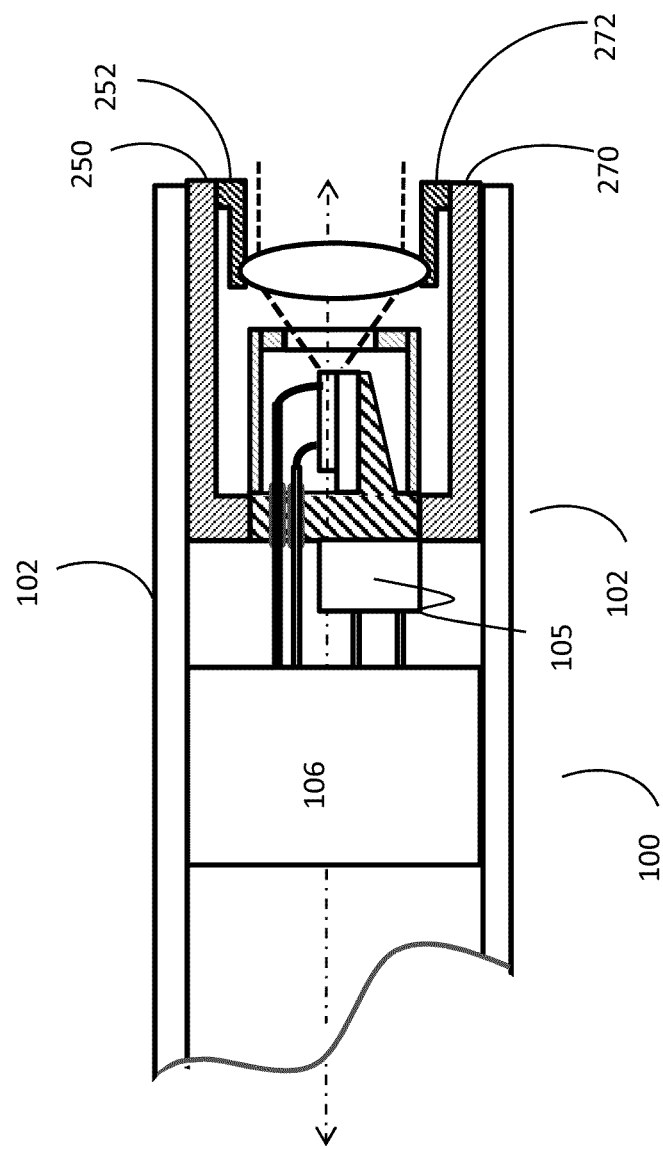
FIG. 18 is a cross-section partial view of an embodiment of a laser module.

As is shown in FIGS. 18 and 19, a laser module 104 such as that illustrated in FIGS. 16 and 17 can be readily incorporated into a laser system 100 that having a cylindrical type system housing 104 as is illustrated general in FIGS. 6-8. In particular it will be understood that by arranging components of system 100 in such a linear fashion it becomes possible to provide a laser housing that advantageously can be hand gripped and that has a cross-section that is smaller.

As is shown in FIGS. 20 and 21, cross-sectional perimeter 300 of frame 200 can be defined in a variety of cross-section shapes. In this embodiment, frame 200 is illustrated having a rectangular shape with curved corners. Other cross sectional perimeter are possible including but not limited to polygonal shapes, curvilinear shapes and irregular shapes the size of which is determined by frame 200 and lens 210. Cross sectional perimeter 300 of frame 200 and lens 210 can comprise a polygon or other shape that conforms to an outermost perimeter of frame 200 and lens 210.

It will be appreciated that in various embodiments, semiconductor laser 180 may comprise a semiconductor laser that generates a divergent laser light 184. By positioning a lens 210 so that the divergent laser light 184 strikes lens 210 after divergent laser light 184 reaches a larger diameter or area than an area of an alternative smaller focal length lens, the larger beam size of divergent laser light at lens 210 allows lens 210 to generate a collimated laser beam 122 having a lower divergence than is possible with an alternative smaller lens 211.

In further exemplary embodiments laser system 100 can be combined with or integrated into other systems including but not limited to thermal viewing systems, surveillance systems, vehicles, robotic equipment, ships and aircraft all of which may be controlled manually or by way of automatic or control systems. In still other embodiments system housing 102 can be shaped and sized to mount to any of a variety of manned or unmanned vehicles used in surveillance, law enforcement, reconnaissance, target marking, friendly force marking, or combat applications. In exemplary embodiments, such vehicles can include, but are not limited to, any unattended ground sensors, self-righting camera balls, and other like portable devices.

In such exemplary embodiments, any and/or all components of laser system 100 may be integrally incorporated into such devices, and in such embodiments, the system housing 102, or portions thereof, may be omitted if desired. For example, in an embodiment in which laser system 100 is formed integrally with an unmanned ground vehicle, an unmanned aqueous vehicle, a mobile robot, an unattended ground sensor, or other like device, the components of the laser module 104 can be hermetically sealed within such devices and the system housing 102 may be omitted to reduce size, weight, space, power consumption, and/or drag associated with laser system 100. In such embodiments, one or more windows, lenses, domes, or other components may be employed proximate to facilitate emission of radiation from laser system 100.

Lens 210 has been shown as a single element lens. This has been done for simplicity. It will be appreciated that lens 210 can comprise any combination of optical elements capable of performing the functions described herein, including but not limited to diffractive or reflective elements.

As noted above, embodiments of semiconductor laser 180 can take the form of a quantum cascade laser or an interband cascade laser operable to produce a beam having a wavelength between approximately 1 μm and approximately 30 μm. In exemplary embodiments, the emitted beam may have a preferred wavelength between approximately 2 μm and approximately 5 μm, or between approximately 7 μm and approximately 30 μm. Although a single solid-state laser is shown in system housing 102, it is contemplated that a plurality of solid-state lasers 180 can be disposed within the system housing 102, some or all of solid-state lasers 180 emitting radiation at different respective wavelengths. In additional exemplary embodiments, a single semiconductor laser 180 can be employed with an appropriate driver 106 and/or filter to provide a plurality of corresponding wavelengths.

Other embodiments of the present disclosure will be apparent to those skilled in the art from consideration of the specification and practice of the various embodiments disclosed herein. It is intended that the specification and examples be considered as exemplary only, with a true scope and spirit of the present disclosure being indicated by the following claims.

What is claimed is:

1. An optical system for a semiconductor laser that emits a divergent laser light, the optical system comprising:
 a lens with a focal length of greater than 10 mm and that can collimate the divergent laser light into a collimated beam having less than a predetermined divergence when the lens is positioned within a larger range of positions about a focal length of the lens; and,
 a frame assembled to the lens to hold the lens within the larger range of positions when the system is in a first range of temperatures;
 wherein the larger range of positions is at least 50 percent greater than a smaller range of positions that an alternate smaller lens having a same numerical aperture as the lens and smaller focal length can be positioned within to provide a collimated beam having less than the predetermined divergence.

2. The optical system of claim 1, wherein at least over a portion of the larger range of positions, the lens provides a collimated laser beam having a lower divergence than the alternate smaller lens can provide when positioned at any position in the smaller range of positions.

3. The optical system of claim 1, wherein the frame positions the lens so that the frame holds the lens within a first portion of the larger range of positions over the first range of temperatures and wherein the frame allows the lens to be positioned within a second portion of the larger range of positions at temperatures that are higher than the first range of temperatures.

4. The optical system of claim 1, wherein at least one of a size, weight, complexity or cross sectional area of the frame is lower than a respective size, weight, complexity or cross-sectional area of an alternate frame that holds the alternate smaller focal length lens in the smaller range of positions over the first range of temperatures.

5. The optical system of claim 1, wherein at least one of a size, weight, complexity or cross sectional area of the frame positioning the lens within the larger range of positions is lower than a respective size, weight, complexity or cross-sectional area of an alternate frame that holds the alternate smaller focal length lens in the smaller range of positions over the first range of temperatures.

6. The optical system of claim 5, wherein at least one of the size, weight, complexity or cross sectional area of a frame positioning the lens with in the second range positions is lower than a respective size, weight, complexity or cross-sectional area of an alternative frame that holds an lens in the first range of positions over the second range of temperatures.

7. A laser system comprising:
 an enclosure having a front wall with a window therein and a back wall from which a header extends;
 a semiconductor laser positioned on the header to direct a divergent laser light through the window; a lens with a focal length of greater than 10 millimeters, and that can collimate the divergent laser light into a collimated beam having less than a predetermined divergence when the lens is positioned within a range of positions about a focal length of the lens; and,
 a frame assembled to the lens to hold the lens apart from the semiconductor laser at or about the focal length of the lens over a range of temperatures; a drive circuit linking a power supply to the semiconductor laser, a housing holding the drive circuit, the power supply, the enclosure, the lens and the frame so that the collimated laser beam emits from the housing;
 wherein the range of positions is at least 50 percent greater than a second range of positions that an alternate lens having a same numerical aperture as the lens and a diameter of less than about 10 mm can be positioned within to provide a collimated beam having less than the predetermined divergence.

8. The laser system of claim 7, wherein the housing has a cross sectional area and wherein at least one of a size, weight, or cross-sectional area of the housing is lower than a respective size, weight, or cross-sectional area of an alternative housing having an alternate frame that holds the alternate smaller lens in the second range of positions over the range of temperatures.

9. The laser system of claim 8, further comprising a thermoelectric cooling system operated by the drive circuit to limit the extent to which any heat generated by operation of the semiconductor laser heats the frame and the lens and wherein a duty cycle of the thermoelectric cooling system is lower in a laser system having the lens than in an alternate system having the alternate lens during an equivalent amount of semiconductor laser usage.

10. The laser system of claim 9, wherein the lower duty cycle of the system having the lens places lower power requirements on the power supply enabling the power supply to be smaller than a power supply in the alternate system for an equivalent level of laser output.

11. A laser module comprising:
 a base with a front side from which a header extends in a first direction and a housing shaped to combine with the front side to create a sealed environment about the header;
 a heat generating laser mounted to the header and directing a divergent laser beam in the first direction through a window on a front portion of the housing;
 a lens shaped to reduce the divergence of the divergent laser beam to a predetermined level and having a focal length of greater than 10 mm;
 a frame joined to the base and extending in the first direction from the base past an end wall of the housing to a first side of the lens in the divergent laser beam so that the lens will emit a laser beam having a limited divergence;
 a plurality of conductors providing electrical connections to allow current to flow to the heat generating laser, said conductors extending through the base in a second direction;
 wherein the housing and the base are positioned within a cross sectional area of the frame and the lens.

12. The laser module of claim 11, wherein the enclosure and the base are sized and positioned for location within a cross sectional profile of the frame and the lens the within a cross sectional profile of the frame and the lens.

13. The laser module of claim 11, wherein the housing and the base are sized and positioned for location within a cross-sectional diameter at least large enough to hold the lens and the frame.

14. The laser module of claim 11, wherein the housing and the frame are sized and positioned for location within a predetermined cross-sectional area having of between 275 and 600 square millimeters.

15. The laser module of claim 11, wherein the lens is at least about 20 mm in diameter.

16. The laser module of claim 11, further comprising a cooling system positioned confronting the base and sized and positioned within a cross-sectional profile of the frame and the lens.

17. The laser module of claim 11, wherein the base, the housing, the frame and the lens are arranged relative to a common axis.

18. The laser module of claim 11, wherein the heat generating laser emits a divergent laser light having more than one mode and wherein the lens receives the divergent laser light and collimates the divergent laser light into a collimated beam having less than a predetermined divergence.

* * * * *